(12) United States Patent
Kawada et al.

(10) Patent No.: US 12,394,764 B2
(45) Date of Patent: Aug. 19, 2025

(54) BLACK MATRIX SUBSTRATE ASSEMBLY AND DISPLAY INCLUDING THE SAME

(71) Applicant: TOPPAN Inc., Taito-ku (JP)

(72) Inventors: Hiroaki Kawada, Taito-ku (JP); Kenzo Fukuyoshi, Taito-ku (JP)

(73) Assignee: TOPPAN Inc., Taito-ku (JP)

( * ) Notice: Subject to any disclaimer, the term of this patent is extended or adjusted under 35 U.S.C. 154(b) by 487 days.

(21) Appl. No.: 17/975,763

(22) Filed: Oct. 28, 2022

(65) Prior Publication Data

US 2023/0047411 A1 Feb. 16, 2023

Related U.S. Application Data

(63) Continuation of application No. PCT/JP2021/014633, filed on Apr. 6, 2021.

(30) Foreign Application Priority Data

Apr. 28, 2020 (JP) ................... 2020-079289

(51) Int. Cl.
*H10K 59/38* (2023.01)
*G02B 5/20* (2006.01)
(Continued)

(52) U.S. Cl.
CPC .......... *H01L 25/0753* (2013.01); *G02B 5/208* (2013.01); *H10H 20/8512* (2025.01);
(Continued)

(58) Field of Classification Search
CPC .. H10K 59/38; H10K 59/878; H10K 59/8792; H10K 50/865; H10K 50/856;
(Continued)

(56) References Cited

U.S. PATENT DOCUMENTS 10,466,534 B2    11/2019  Ajichi
2008/0246396 A1*  10/2008  Watanabe ............ H10K 50/856
                                                          313/512
(Continued)

FOREIGN PATENT DOCUMENTS

JP    2015-064391 A    4/2015
JP    2018-189920 A   11/2018
(Continued)

OTHER PUBLICATIONS

International Search Report issued May 25, 2021 in PCT Application No. PCT/JP2021/014633 filed Apr. 6, 2021, 5 pages (with English Translation).

*Primary Examiner* — Angela M. Medich
(74) *Attorney, Agent, or Firm* — Oblon, McClelland, Maier & Neustadt, L.L.P.

(57) ABSTRACT

A black matrix substrate assembly including a transparent substrate, a black matrix pattern, a transparent resin layer, a resin wall pattern, a light reflective layer, and a transparent protective layer. The black matrix pattern includes first and second black linear segments with a width Ax of each first segment in a first direction. The resin wall pattern includes first and second wall linear segments with a width Dx of each first segment smaller than the width Ax in the first direction and the center line of each first segment aligned with that of the corresponding first black linear segment. The light reflective layer includes first and second reflective linear segments with a width Cx of each first segment larger than the width Dx in the first direction and the center line of each first segment aligned with that of the corresponding first black linear segment.

16 Claims, 13 Drawing Sheets

(51) Int. Cl.
*H01L 25/075* (2006.01)
*H10H 20/851* (2025.01)
*H10H 20/856* (2025.01)
*H10K 50/856* (2023.01)
*H10K 50/86* (2023.01)
*H10K 59/80* (2023.01)
*H10K 71/00* (2023.01)
*H10H 20/01* (2025.01)

(52) U.S. Cl.
CPC ......... *H10H 20/856* (2025.01); *H10K 50/856* (2023.02); *H10K 50/865* (2023.02); *H10K 59/38* (2023.02); *H10K 59/878* (2023.02); *H10K 59/8792* (2023.02); *H10K 71/00* (2023.02); *H10H 20/0363* (2025.01)

(58) Field of Classification Search
CPC ................ H10H 20/856; H10H 20/882; G02F 1/133512; F21V 9/30; F21K 9/64
See application file for complete search history.

(56) References Cited

U.S. PATENT DOCUMENTS

2016/0372528 A1* 12/2016 Kamura ................. H10K 30/87
2019/0146277 A1    5/2019 Ajichi
2021/0336224 A1* 10/2021 Yun ....................... H10K 71/00

FOREIGN PATENT DOCUMENTS

WO    WO 2017/191714 A1    11/2017
WO    WO 2019/026826 A1    2/2019

* cited by examiner

BLACK MATRIX SUBSTRATE ASSEMBLY AND DISPLAY INCLUDING THE SAME

CROSS-REFERENCE TO RELATED APPLICATIONS

The present application is a continuation of International Application No. PCT/JP2021/014633, filed Apr. 6, 2021, which is based upon and claims the benefits of priority to Japanese Application No. 2020-079289, filed Apr. 28, 2020. The entire contents of all of the above applications are incorporated herein by reference.

BACKGROUND OF THE INVENTION

Field of the Invention

The present invention relates to a black matrix substrate assembly, and a display including the black matrix substrate assembly.

Discussion of the Background

PTL 1 describes a backlight unit including blue light-emitting devices, a wavelength conversion sheet configured to convert the wavelength of light emitted from the blue light-emitting devices, and a light reflective dividing wall.

However, because PTL 1 does not describe the reflective material of the dividing wall or the structure thereof, the method for forming the dividing wall is unclear, which makes it difficult for a third party to carry out the technique(s) described in PTL 1.

PTL 2 describes techniques for a dividing wall, color conversion portions, and the like. The dividing wall has through holes extending in a thickness direction of an optically transmissive substrate. The color conversion portions are disposed in respective through holes of the dividing wall and each contain a light color conversion material.

For the color filter 10 described in FIG. 2 and the like of PTL 2, the configurations of red colored portions 131R, green colored portions 131G, blue colored portions 131B, and color conversion portions 132 are described therein. As shown, the light-shielding portion 122 has a thickness T2 including the heights of the red colored portions 121R and color conversion portions 132. PTL 2 states in paragraph [0017] that the thickness T2 may be about 10 µm. A specific method is unclear from PTL 2 for forming a thick light-shielding portion 122 that contains a black colorant having light-shielding properties, such as carbon black. Although the optical density of the light-shielding portion 122 is unclear in PTL 2, when a known photolithography technique involving exposure and development is used in forming a 10-µm-thick black matrix pattern from a material having an optical density of around 4, which is a value usually selected to prevent incident light from entering an adjacent pixel, exposure light is not easily transmitted through a film of the above material in its thickness direction. Thus, in this case, it is difficult to form a thick black matrix pattern. PTL 2 does not disclose a technique for forming light reflective films.

PTL 3 describes techniques for a fluorescent substrate assembly that includes fluorescent layers and a reflective dividing wall surrounding the fluorescent layers. The fluorescent substrate assembly is configured to prevent excitation light from being incident on a pixel adjacent to a pixel desired to receive the excitation light.

In paragraphs [0010] to [0013], PTL 3 describes the structure of a dividing wall including a light-scattering layer and a light-absorbing layer laminated on each other. The light scattering layer is composed of a material containing a resin and light-scattering particles. PTL 3 states in paragraph [0077] that the light-scattering layer illustrated in FIG. 1 has a thickness of about 1 to 100 µm, and in paragraph [0080] that the dividing wall is desired to be formed by photolithography. Although the optical density is unclear in PTL 3 as with PTL 2, when a known photolithography technique involving exposure and development is used in forming a light-scattering layer with a thickness of 10 µm or more from a photosensitive light-scattering material having an optical density of around 4, which is a typically required value, to thereby produce a dividing wall, exposure light is not easily transmitted through a film of the above material in its thickness direction. Furthermore, the exposure light is scattered by light-scattering particles, so that the resulting pattern has openings larger than those of a photomask. Thus, in this case, it is difficult to form a high-resolution pattern.

PTL 4 describes a backlight unit including ultraviolet light-emitting devices, blue light-emitting devices, a fluorescent substrate assembly, and a light reflective dividing wall. The fluorescent substrate assembly is configured to convert the wavelength of light emitted from the ultraviolet light-emitting devices and blue light-emitting devices.

In paragraphs [0018], [0021] and [0022], PTL 4 describes a film of aluminum, aluminum alloy, or the like as a metal film, although it is not clear therefrom whether the metal film is used for absorbing light or reflecting light. Although PTL 4 describes in paragraph [0021] the use of laser ablation in forming a pattern of a metal film (for removal of unnecessary portions of the metal film on the bottom of each opening), it does not describe possible damage to, for example, a circuit board or LEDs, such as the influence of high temperatures, contamination by spattered aluminum, and the like due to laser irradiation. PTL 4 describes in paragraph [0022] a lift-off method of removing the unnecessary portions of the metal film, but it does not specifically describe techniques of resist application, exposure, development, and the like for a lift-off process that reflects the consideration of the height of the dividing wall (asperities).

PTL 1: WO 2017/191714
PTL 2: JP 2018-189920 A
PTL 3: JP 2015-064391 A
PTL 4: WO 2019/026826

SUMMARY OF THE INVENTION

According to an aspect of the present invention, a black matrix substrate assembly, includes a transparent substrate having a surface, a black matrix pattern formed on the surface, a transparent resin layer that covers the black matrix pattern, a resin wall pattern formed on the transparent resin layer, a light reflective layer formed on the resin wall pattern, and a transparent protective layer formed on the light reflective layer. When viewed in a view direction perpendicular to the surface of the transparent substrate, the black matrix pattern includes first black linear segments and second black linear segments that are formed two-dimensionally, the first black linear segments each have a width Ax in a first direction and have a first center line, and the second black linear segments each have a width Ay in a second direction and have a second center line, the resin wall pattern includes first wall linear segments and second wall linear segments, the first wall linear segments each have a width Dx in the first direction and have a first center line, the second wall linear segments each have a width Dy in the second direction and have a second center line, the width Dx is smaller than the width Ax, and the width Dy is smaller than the width Ay. When viewed in the view direction, the first center line of each first wall linear segment is aligned with the first center line of a corresponding first black linear segment, and the second center line of each second wall linear segment is aligned with the second center line of a corresponding second black linear segment, the light reflective layer includes first reflective linear segments and second reflective linear segments, the first reflective linear segments each have a width Cx in the first direction and have a first center line, the second reflective linear segments each have a width Cy in the second direction and have a second center line, the width Cx is larger than the width Dx, and the width Cy is larger than the width Dy. When viewed in the view direction, the first center line of each first reflective linear segment is aligned with the first center line of the corresponding first black linear segment, the second center line of each second reflective linear segment is aligned with the second center line of the corresponding second black linear segment, each first reflective linear segment of the light reflective layer includes a pair of first brims each having a width Ex and formed within the width Ax of the corresponding first black linear segment when viewed in the view direction, the first brims extend in an opposite direction from both ends of the corresponding first light reflective linear segment along with the first direction to be symmetric with respect to the first center line of the corresponding first reflective linear segment, each second reflective linear segment of the light reflective layer includes a pair of second brims each having a width Ey and formed within the width Ay of the corresponding second black linear segment when viewed in the view direction, the second brims extend in an opposite direction from both ends of the corresponding second light reflective linear segment along with the second direction to be symmetric with respect to the second center line of the corresponding second reflective linear segment, the transparent protective layer includes first protective linear segments and second protective linear segments, the first protective linear segments each have a width Bx in the first direction and, the second protective linear segments each have a width By in the second direction, the width Bx of each first protective linear segment is greater than or equal to a first total width of the corresponding first reflective linear segment when viewed in the view direction, the first total width of each first reflective linear segment is a sum of the width Cx and the widths Ex of the first brims, the width By of each second protective linear segment is greater than or equal to a second total width of the corresponding second reflective linear segment when viewed in the view direction, and the second total width of each second reflective linear segment is a sum of the width Cy and the widths Ey of the second brims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
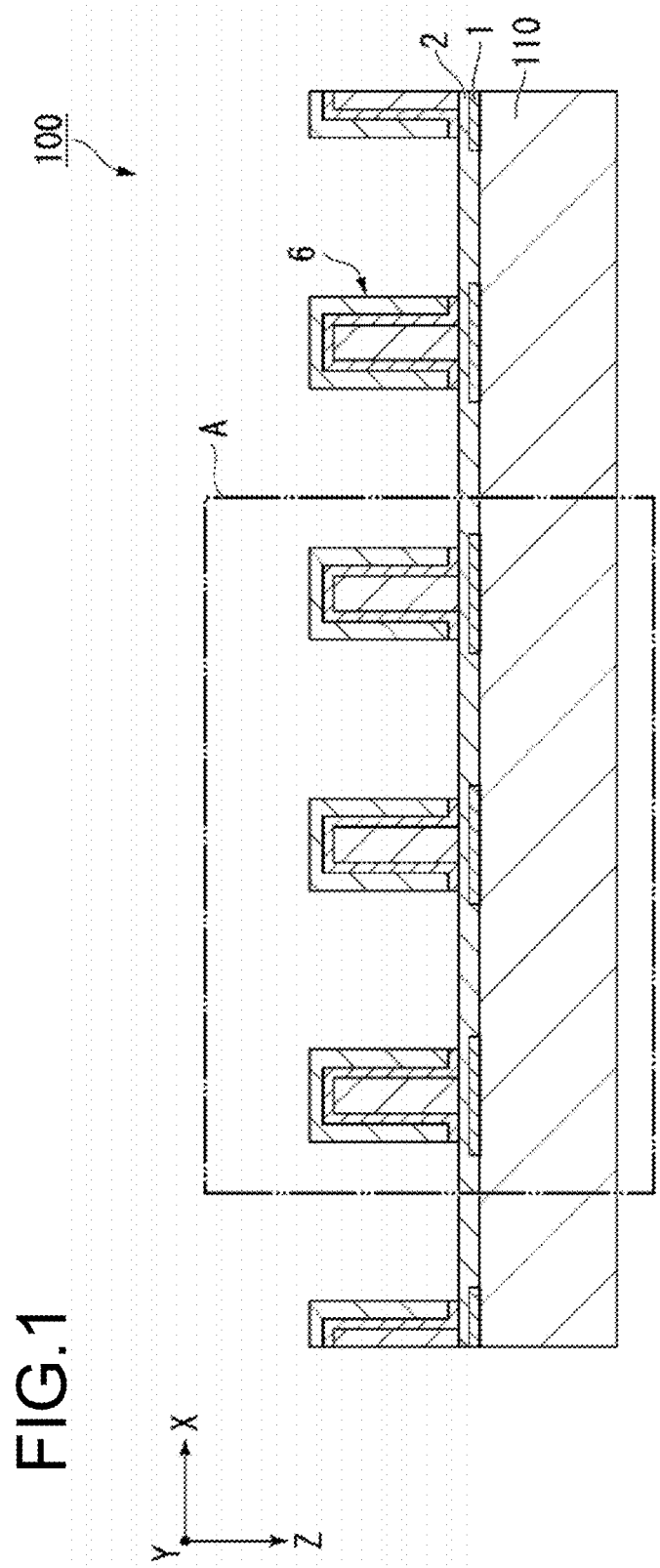
FIG. 1 is a partial cross-sectional view of a black matrix substrate assembly according to a first embodiment of the present invention.

The embodiments will now be described with reference to the accompanying drawings, wherein like reference numerals designate corresponding or identical elements throughout the various drawings.

With reference to the drawings, embodiments of the present invention will be described.

In the following description, identical or substantially identical functions and components are denoted by the same reference signs, and the description thereof will be omitted or simplified, or will be provided only where necessary. Additionally, illustration is wholly or partially omitted where necessary for elements difficult to illustrate, such as the configuration of a thin-film transistor and the like, the structure of layers constituting a conductive layer, the wiring to a circuit, and switching elements (transistors).

In the embodiments described below, only characteristic components will be described, and no description is provided of, for example, components used in general-purpose displays.

Ordinal numbers including "first" and "second", as in a first substrate, a second substrate, a first transparent resin layer, a second transparent resin layer, and a third transparent resin layer, are used to avoid confusion between components, and the usage of ordinal numbers does not limit the quantity thereof. A matrix array of light-emitting devices refers to an array in which light-emitting units each including at least one light-emitting device are arranged in a matrix with a constant pitch in plan view. In the following description, the term "optical module" may refer to a module including light-emitting devices disposed in a matrix array. When used in a display, the light-emitting units are surrounded by a grid (first grid) of linear segments of a black matrix pattern in plan view. The light-emitting units, which are surrounded by the black matrix pattern in plan view, each include at least one light-emitting diode as a light-emitting element. For displays using a local dimming technique described later, driving on and off of light-emitting units each including at least one light-emitting device and adjustment of the intensity of light emitted therefrom can be performed individually or collectively. With a local dimming technique, the number of light-emitting devices in a light-emitting unit can be less than the number of pixels dedicated to the light-emitting unit in plan view. In other words, the local dimming has the advantage of enabling efficient operation of a display by allowing the number of light-emitting devices to be less than the number of pixels.

The term "in plan view" as used herein may refer to "in plan view" when viewed perpendicular to a first major surface of a transparent substrate, and "in plan view" when viewed in a direction normal to a second major surface (facing away from the first major surface) of the transparent substrate. The former "in plan view" may be referred to as "in plan view when viewed in the observation direction".

The black matrix pattern, resin wall pattern, light reflective layer, and transparent protective layer according to an embodiment of the present invention, each having line symmetry about a center line at respective segments in their width directions, overlap each other such that the center lines thereof are aligned. This center line is referred to as "central axis". In the drawings, the central axis is indicated by a dot-dashed line.

First Embodiment

Figure 2:
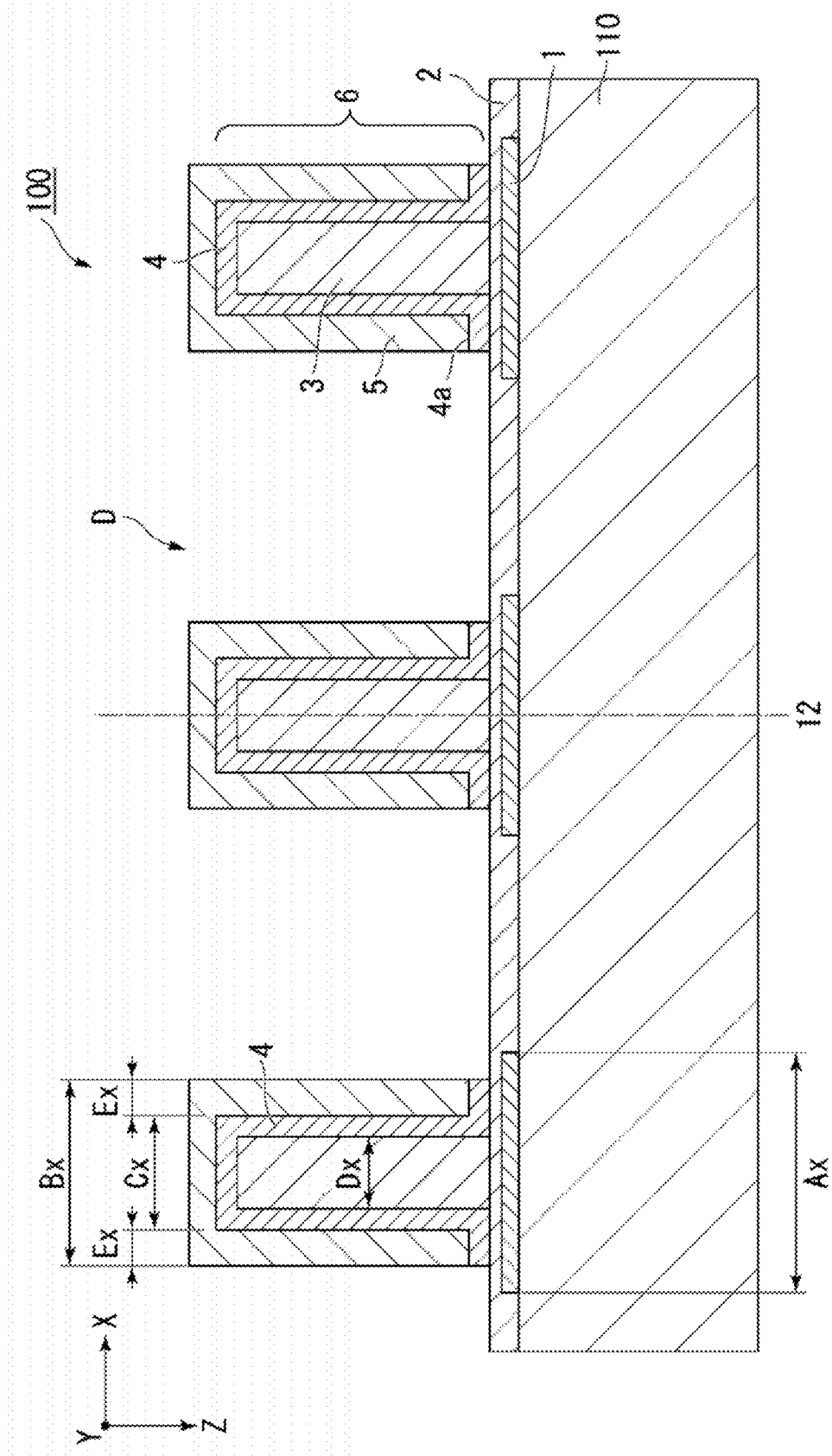
FIG. 2 is an enlarged view of a portion A of FIG. 1, corresponding to a cross-sectional view taken along line B-B' in FIG. 3.
Figure 3:
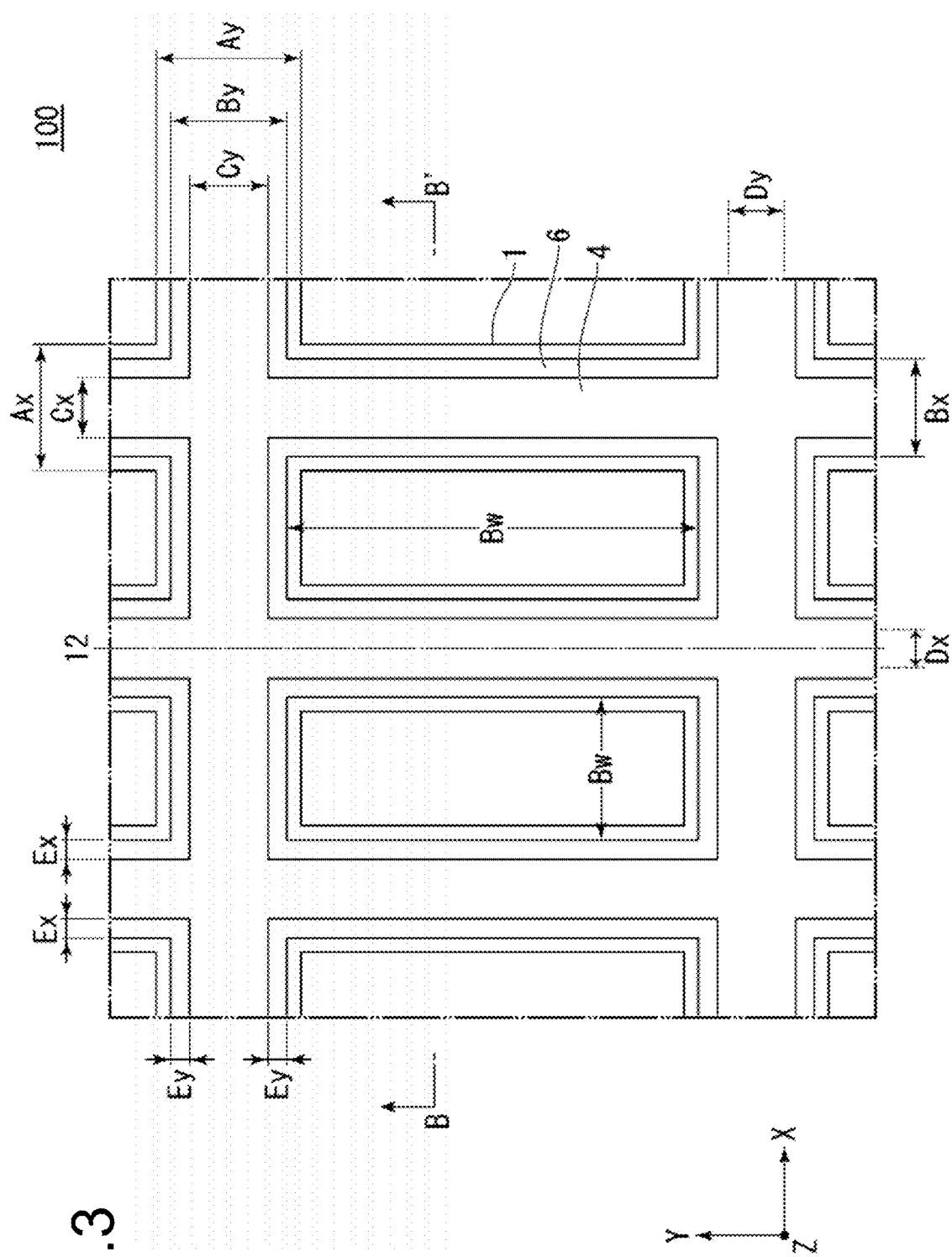
FIG. 3 is a partial plan view of the black matrix substrate assembly according to the first embodiment of the present invention, with the substrate assembly viewed in a direction Din FIG. 2 (as viewed perpendicular to a major surface of a substrate assembly 100).

With reference to FIGS. 1 to 3, a black matrix substrate assembly according to embodiments of the present invention will be described.

FIG. 1 is a partial cross-sectional view of a black matrix substrate assembly 100 according to an embodiment of the present invention. FIG. 2 is an enlarged view of a portion A of FIG. 1. FIG. 3 is a plan view of the black matrix substrate assembly 100, as viewed in a direction perpendicular to a major surface of a transparent substrate 110 shown in FIG. 2 (the direction D in which a light reflective dividing wall 6 is seen). It should be noted that the X direction and the Y direction in FIGS. 1 to 3 correspond to "first direction" and "second direction" recited in claim 1, respectively. Furthermore, the Z direction is, in other words, a direction in which the light reflective dividing wall 6 has a height (thickness).

As illustrated in FIG. 1, the black matrix substrate assembly 100 includes the transparent substrate 110, a black matrix pattern 1 disposed on the transparent substrate 110, a first transparent resin layer 2, and a light reflective dividing wall 6 disposed on the first transparent resin layer 2.

As illustrated in FIGS. 2 and 3, the light reflective dividing wall 6 includes a resin wall pattern 3, a light reflective layer 4, and a transparent protective layer 5. The resin wall pattern 3 includes first and second wall linear segments. The first wall linear segments are arranged in the first direction (the X direction in the drawings) and each have a width Dx, whereas the second wall linear segments are arranged in the second direction (the Y direction in the drawings) and each have a width Dy.

The light reflective layer 4 is formed on the resin wall pattern 3 and includes first and second reflective linear segments. The first reflective linear segments are arranged in the first direction (the X direction in the drawings) and each have a width Cx, whereas the second reflective linear segments are arranged in the second direction (the Y direction) and each have a width Cy. The width Cx includes the width Dx of the resin wall pattern 3.

The transparent protective layer 5 is formed so as to cover the light reflective layer 4. The transparent protective layer 5 includes first and second protective linear segments. The first protective linear segments are arranged in the first direction (the X direction) and each have a width Bx, whereas the second protective linear segments are arranged in the second direction (the Y direction) and each have a width By. The width Bx includes the width Cx of the light reflective layer 4.

Similarly, the black matrix pattern 1 includes first and second black linear segments such that the first black linear segments are arranged in the first direction (the X direction) and each have a width Ax, whereas the second black linear segments are arranged in the second direction (the Y direction) and each have a width Ay. The width Bx may be less than or equal to the width Ax. The width By may be less than or equal to the width Ay.

As illustrated in FIG. 3, the black matrix pattern 1, transparent protective layer 5, light reflective layer 4, and resin wall pattern 3 have respective grid patterns and overlap each other in plan view such that their central axes 12 are aligned. As understood from FIG. 3, the widths of the black matrix pattern 1, transparent protective layer 5, light reflective layer 4, and resin wall pattern 3 decrease in this order.

Each first reflective linear segment of the light reflective layer 4 includes a pair of first brims 4a extending from both ends of the corresponding first light reflective linear segment oppositely in the first direction to be symmetric with respect to the central axis 12 of the corresponding first reflective linear segment. Each of the first brims 4a has a width Ex. Each second reflective linear segment of the light reflective layer 4 includes a pair of second brims 4a extending from both ends of the corresponding second light reflective linear segment opposingly in the second direction to be symmetric with respect to the central axis of the corresponding second reflective linear segment. Each of the second brims 4a has a width Ey.

Thus, the widths described above satisfy the following relationships.

$$Ax \geq Bx > Cx > Dx \quad (1)$$

$$Bx = Cx + 2Ex \quad (2)$$

$$Ay > By > Cy > Dy \quad (3)$$

$$By = Cy + 2Ey \quad (4)$$

<Method for Producing Black Matrix Substrate Assembly According to Embodiment of Present Invention>

With reference to FIGS. 11 to 19, methods for producing the black matrix 1, transparent protective layer 5, light reflective layer 4, and resin wall pattern 3 will be described. FIGS. 11 to 19 are partial cross-sectional views illustrating structures in respective steps during production of the black matrix substrate assembly according to embodiment of the present invention.

Figure 11:
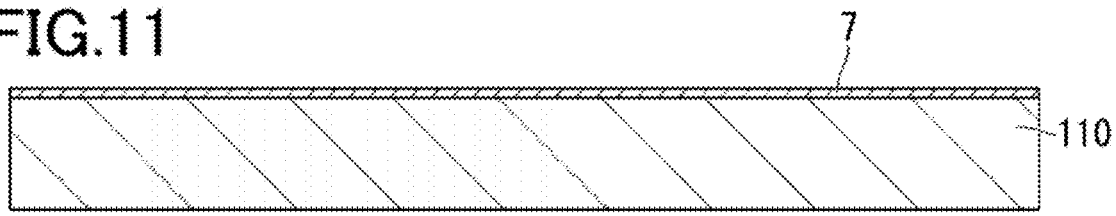
FIG. 11 is a cross-sectional view of a transparent substrate having formed thereon a black film entirely covering a surface thereof, illustrating a state in the first step during production of a black matrix substrate assembly according to an embodiment of the present invention.

FIG. 11 illustrates a black film 7 formed on the transparent substrate 110 by applying a black photosensitive resist (e.g., an alkali-soluble negative resist).

Figure 12:
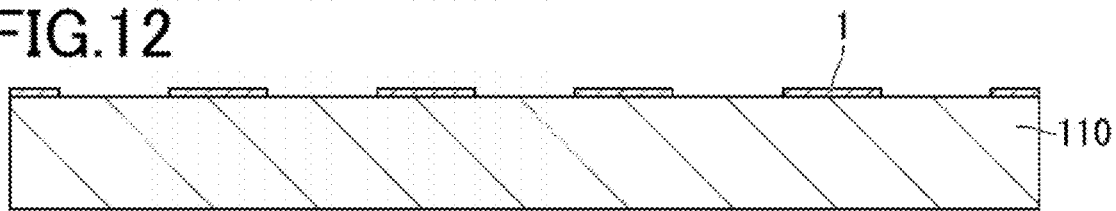
FIG. 12 is a cross-sectional view of a black matrix formed by patterning the black film, illustrating a state in another step during production of the black matrix substrate assembly according to an embodiment of the present invention.

The black film 7 is subjected to exposure, development, and curing using a known photolithography technique, to form the black matrix pattern 1 shown in FIG. 12. The black matrix pattern 1 thus formed may have an optical density in the range of 1 to 3. Alternatively, the black matrix pattern 1 may have an optical density of 1 or less. The black matrix pattern 1 can have such a low optical density because the light reflective layer 4 is formed of aluminum or silver, as an element having light-shielding properties, or alloy of aluminum or silver and one or more other elements, as will be described in connection with the step discussed later. In other words, by effectively using light-shielding properties of the light reflective layer 4 disposed below the black matrix pattern in plan view, the black matrix pattern 1 may be a thin film having a thickness of, for example, not less than 0.3 μm and not more than 1.0 μm or less than 1.5 μm. If the black matrix pattern 1 has a thickness of 1.5 μm or more, the first transparent resin layer 2 formed in the next step will have an uneven thickness, undesirably resulting in the uneven height and irregular shape of the light reflective dividing wall 6. If the black matrix pattern 1 has a thickness of less than 0.3 μm, display quality is easily degraded because when external light is incident on the light reflective layer below the black matrix pattern 1 and reflected therefrom as reflected light, this reflected light is transmitted through the black matrix pattern 1.

The above process of applying a black photosensitive resist to form the black film 7 and forming the black matrix pattern 1 using a known photolithography technique is referred to as "a step of forming a black matrix pattern".

Figure 13:
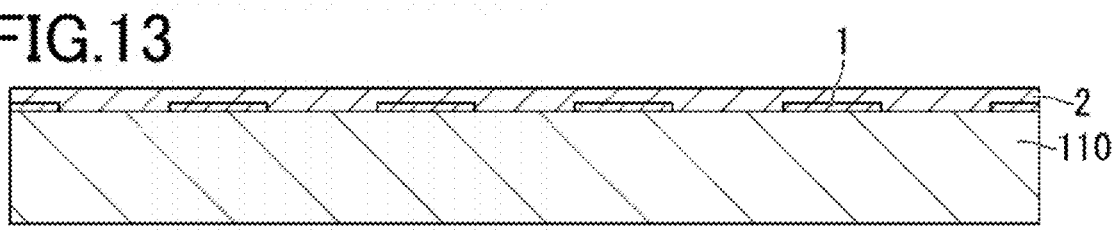
FIG. 13 is a cross-sectional view of the black matrix having formed thereon a first transparent resin layer, illustrating a state in another step during production of the black matrix substrate assembly according to an embodiment of the present invention.

FIG. 13 illustrates a structure including the first transparent resin layer 2 covering the black matrix pattern 1.

Figure 14:
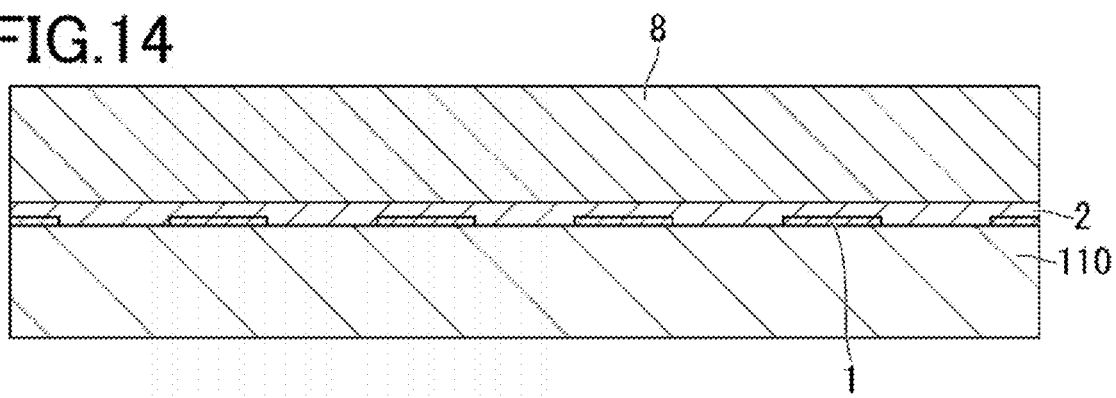
FIG. 14 is a partial cross-sectional view of the black matrix with a photosensitive resin film formed on the first transparent resin layer, illustrating a state in another step during production of the black matrix substrate assembly according to an embodiment of the present invention.
Figure 15:
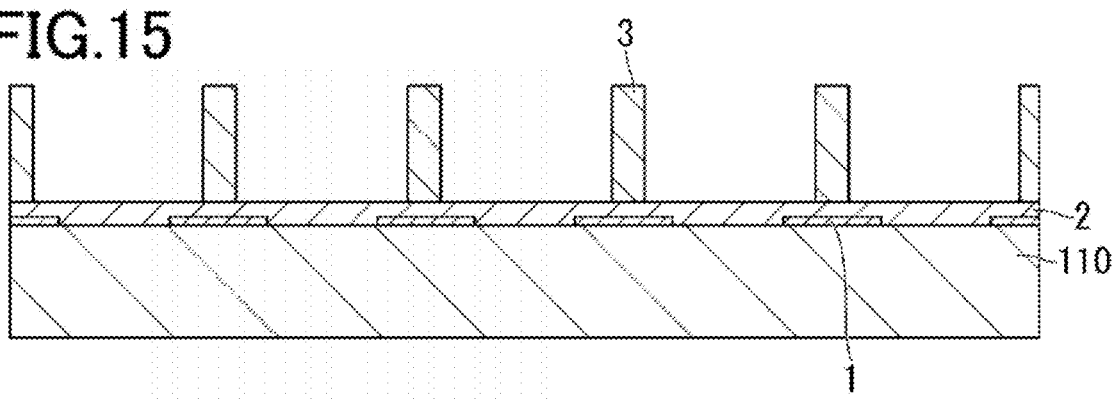
FIG. 15 is a partial cross-sectional view of a resin wall pattern formed by patterning the photosensitive resin film, illustrating a state in another step during production of the black matrix substrate assembly according to an embodiment of the present invention.

FIG. 14 illustrates a structure including a photosensitive resin film 8 over the first transparent resin layer 2. The photosensitive resin film 8 is subjected to exposure, development, and curing using a known photolithography technique, to form the resin wall pattern 3 shown in FIG. 15.

The photosensitive resin film 8 may be a negative or positive, transparent resist that contains no coloring pigments such as white pigments or black pigments.

The resin wall pattern 3 may have a height (thickness) of, for example, 2 μm or more and 200 μm or less. The resin wall pattern 3 may have this thickness as the thickness of the light reflective dividing wall 6. When the black matrix substrate assembly 100 is used in a display, the light reflective dividing wall 6 may have a height of more than 200 μm including the height of light-emitting devices, such as LED chips. The height of the light reflective dividing wall 6 will be specifically described in an embodiment of a display discussed later. The process of laminating the photosensitive resin film 8 and forming the resin wall pattern 3 using a known photolithography technique is referred to as "step of forming a resin wall pattern 3".

Figure 16:
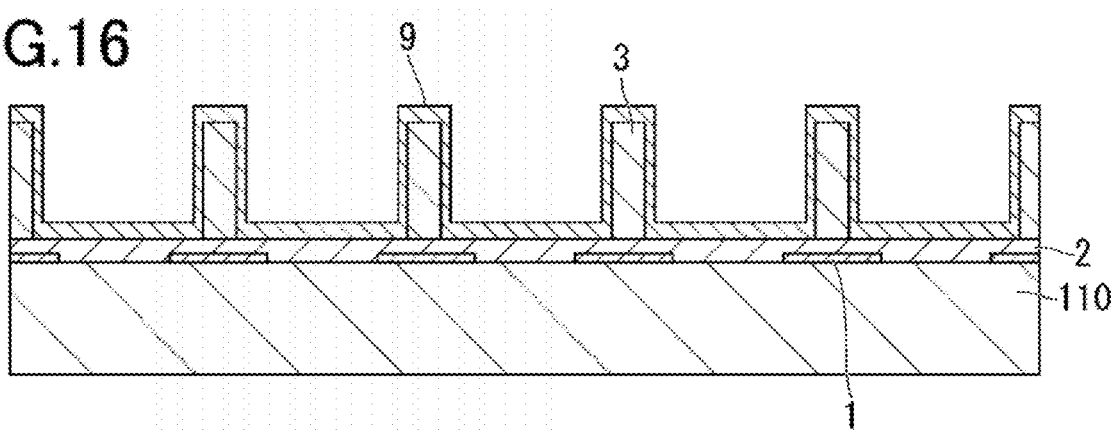
FIG. 16 is a partial cross-sectional view of a structure having the first transparent resin layer and resin wall pattern covered with a thin metal film, illustrating a state in another step during production of the black matrix substrate assembly according to an embodiment of the present invention.

Subsequently, as illustrated in FIG. 16, a light reflective, thin metal film 9 is formed using a method of vacuum film formation, such as vacuum deposition or sputtering, so as to cover the resin wall pattern 3 and first transparent resin layer 2. The thin metal film 9 may be a light reflective thin film composed of, for example, aluminum, aluminum alloy, silver, or silver alloy. The thin metal film 9 is patterned to form a light reflective layer 4 in a step performed later. The thin film of aluminum, aluminum alloy, silver, or silver alloy may have a thickness of, for example, 0.1 μm to 0.3 μm. This thin film having a thickness of 0.1 μm or more achieves a sufficient visible light reflectance and an optical density of 4 or more as a light-shielding property. In terms of light reflectance, the reflectance is not likely to be improved with the thin film having a thickness of 0.1 μm or more. The thin metal film 9 tends to have a greater thickness at portions deposited on the top of the resin wall pattern 3 than at portions deposited on respective side surfaces of the resin wall pattern 3 as shown. The thin metal film 9 is preferably formed so as to have a thickness of 0.1 μm or more at portions deposited on respective side surfaces of the resin wall pattern 3.

Figure 17:
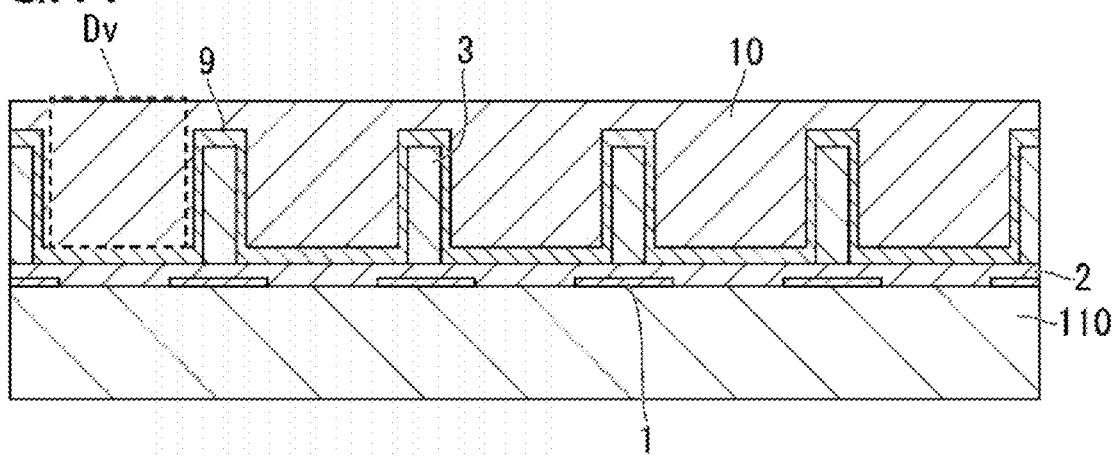
FIG. 17 is a partial cross-sectional view of a structure with a photosensitive protective film formed on a light reflective layer, illustrating a state in another step during production of the black matrix substrate assembly according to an embodiment of the present invention.
Figure 18:
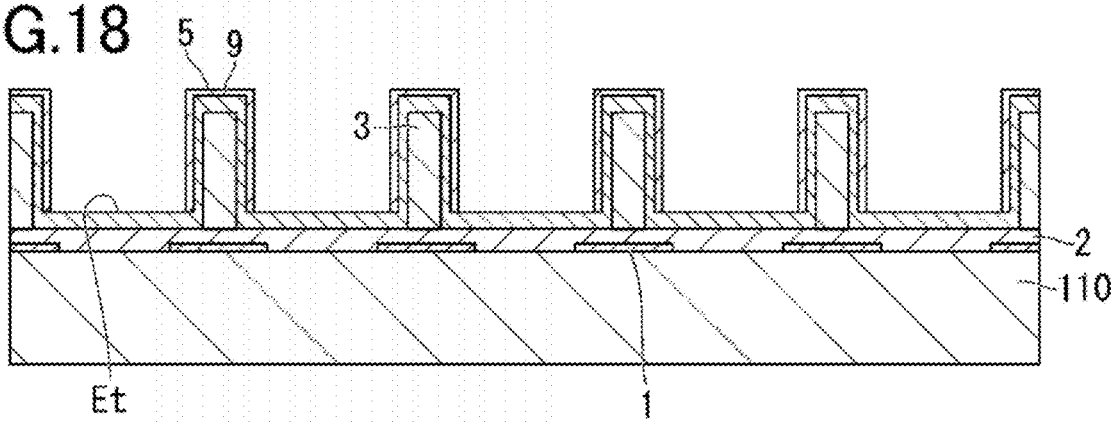
FIG. 18 is a partial cross-sectional view of a structure having a transparent protective layer formed by patterning the photosensitive protective film, illustrating a state in another step during production of the black matrix substrate assembly according to an embodiment of the present invention.

As illustrated in FIG. 17, a photosensitive protective film 10 is applied for lamination so as to cover the thin metal film 9 and resin wall pattern 3. The photosensitive protective film 10 is subjected to exposure, development, and curing using a known photolithography technique, to form the transparent protective layer 5 shown in FIG. 18. The photosensitive protective film 10 may be a negative or positive, transparent resist that contains no coloring pigments such as white pigments or black pigments. FIG. 17 illustrates a development removal portion Dv as a portion of the photosensitive protective film 10 to be removed by development. Portions of the thin metal film 9 as the base of respective development removal portions Dv are exposed as exposed portions Et (see FIG. 18) by development.

Figure 19:
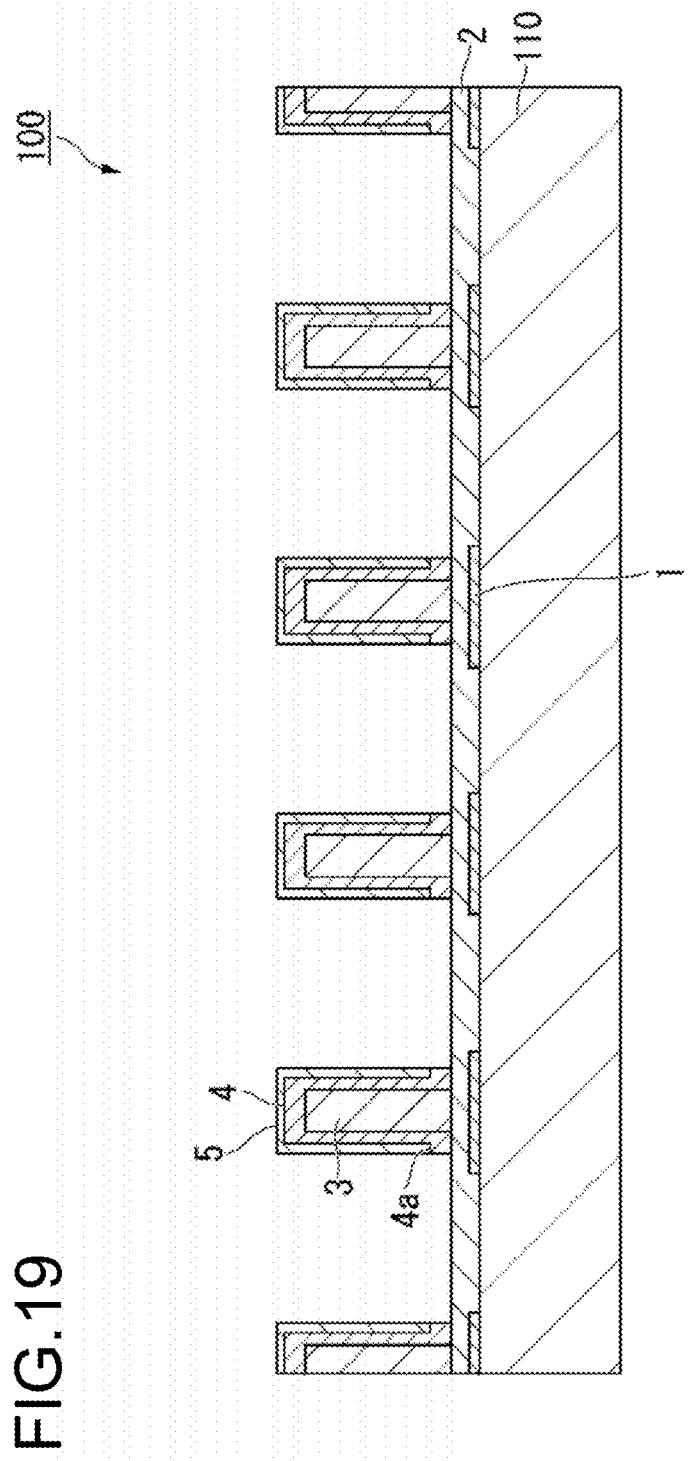
FIG. 19 is a cross-sectional view of a black matrix substrate assembly having a light reflective layer with a pattern formed by removing exposed portions of the thin metal film, illustrating a state in the final step during production of the black matrix substrate assembly according to an embodiment of the present invention.

Subsequently, the thin metal film 9 is subjected to wet etching using the transparent protective layer 5 as a mask, so that the exposed portions Et are removed. Thus, the light reflective layer 4 of FIG. 19 is formed. In the step illustrated in FIG. 19, the exposed portions Et are removed by a simple wet etching process that causes no thermal damage, so that pixel openings 11 (see FIG. 4) are provided. Thus, the black matrix substrate assembly 100 including the light reflective dividing wall according to an embodiment of the present invention is produced.

Examples of etchants used for wet etching include a nitric acid-acetic acid etching solution, an etching solution containing ferric chloride, an etching solution prepared by adding an oxidant such as ceric ammonium nitrate, ammonium fluoride, or organic sulfonic acid to these solutions, and an alkaline etching solution, such as a sodium hydroxide solution or a potassium hydroxide solution.

Figure 6:
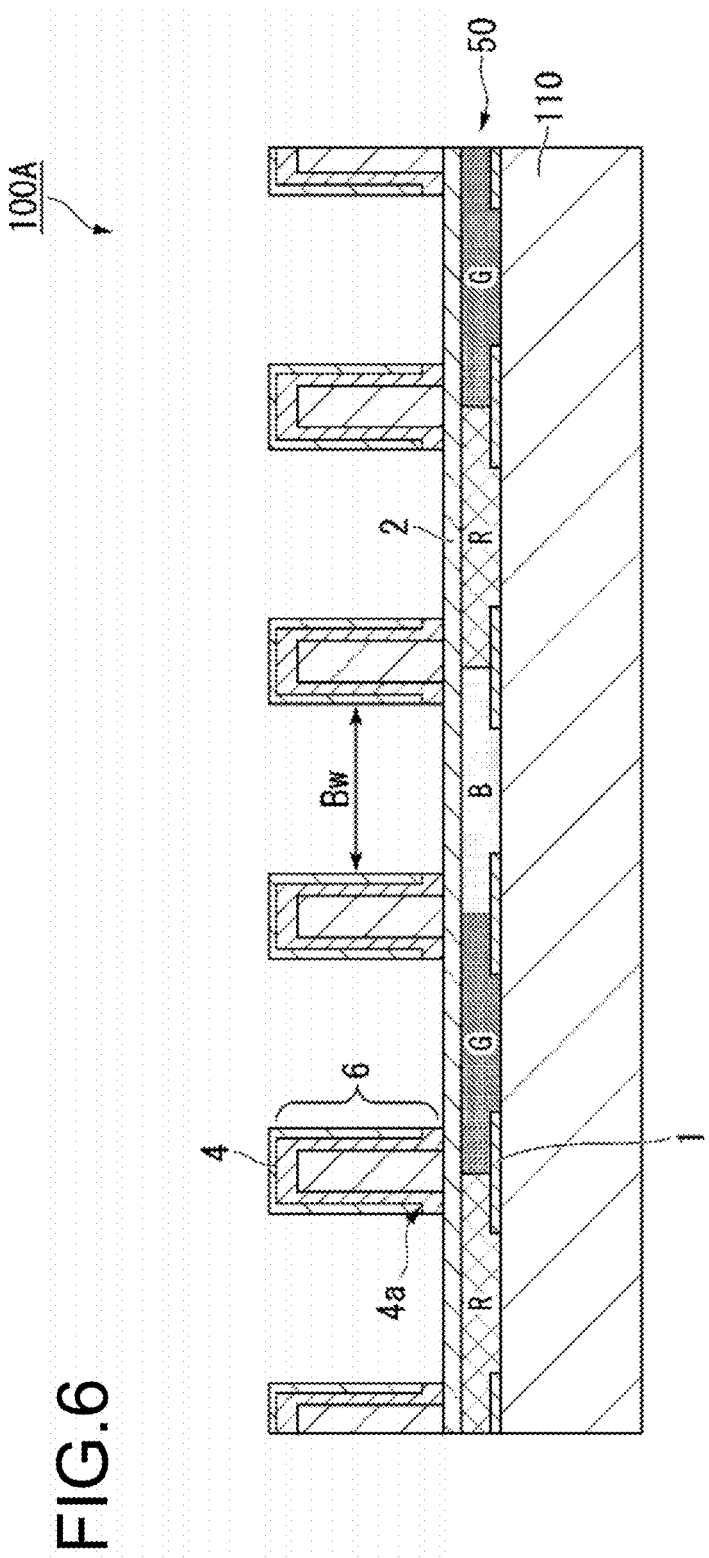
FIG. 6 is a partial cross-sectional view of a black matrix substrate assembly according to a first modification of the first embodiment of the present invention.

The production method described above may be a method for producing a black matrix substrate assembly including a light reflective dividing wall, such that the method further includes a step of forming color filters 50, which are illustrated in FIG. 6 and described later, including a red filter, a green filter, and a blue filter, between the step of forming a black matrix pattern and the step of forming a first transparent resin layer on the black matrix pattern.

Figure 7:
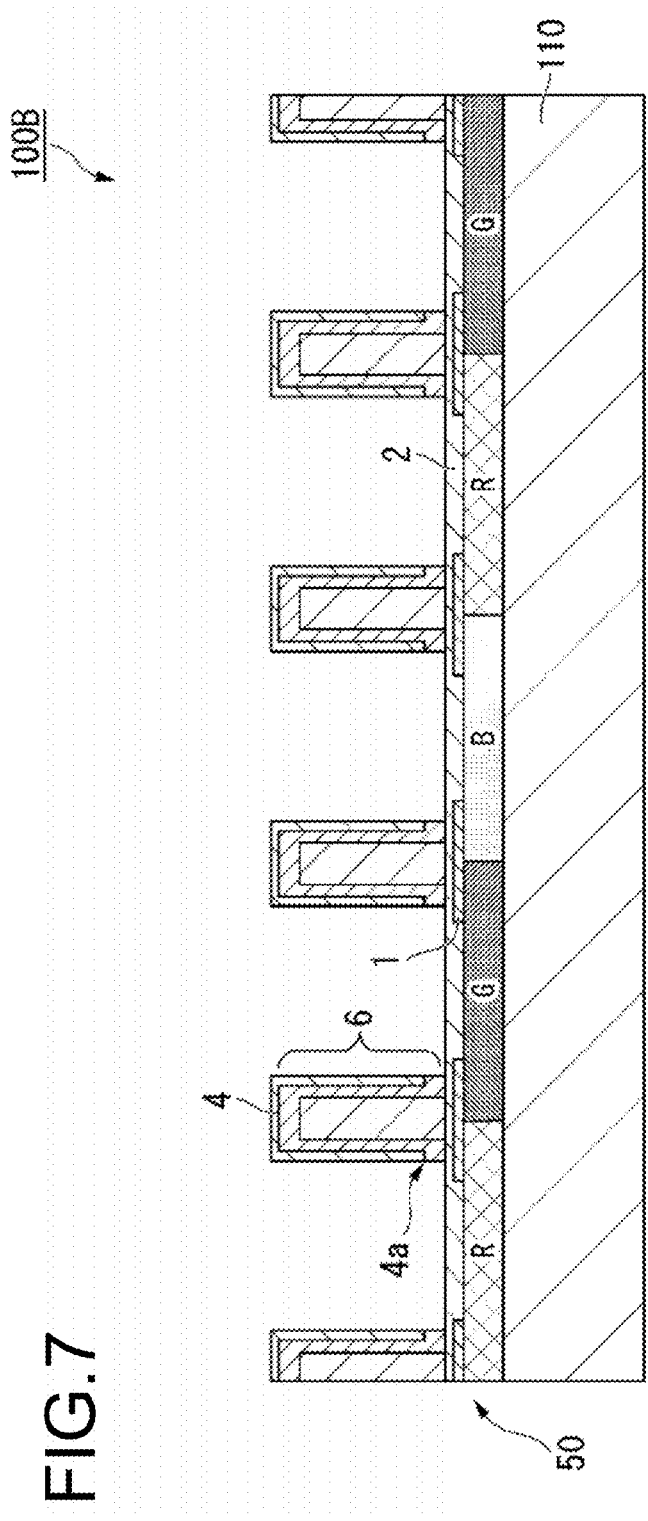
FIG. 7 is a partial cross-sectional view of a black matrix substrate assembly according to a second modification of the first embodiment of the present invention.

Alternatively, the production method described above may be a method for producing a black matrix substrate assembly including a light reflective dividing wall, such that the method further includes a step of forming color filters 50, which are illustrated in FIG. 7 and described later, including a red filter, a green filter, and a blue filter on the transparent substrate, before the step of forming a black matrix pattern.

First Modification of First Embodiment

FIG. 6 is a partial cross-sectional view of a black matrix substrate assembly 100A having color filters 50 including red filters R, green filters G, and blue filters B such that the color filters are disposed between the black matrix pattern 1 and the first transparent resin layer 2. The red filter R, green filter G, and blue filter B may be formed in any order.

As will be described later, wavelength conversion layers, light-scattering layers, or mixed layers comprised of wavelength conversion material and light-scattering material may be disposed in respective regions Bw surrounded by the light reflective dividing wall.

Second Modification of First Embodiment

FIG. 7 is a partial cross-sectional view of a black matrix substrate assembly 100B having color filters 50 including red filters R, green filters G, and blue filters B such that the color filters are disposed between the transparent substrate 110 and the black matrix pattern 1. The red filter R, green filter G, and blue filter B may be formed in any order. Since the color filters including red filters R, green filters G, and blue filters B are formed on the flat transparent substrate before formation of the black matrix pattern, the color filters of the second modification have higher flatness.

As will be described later, wavelength conversion layers, light-scattering layers, or mixed layers comprised of wavelength conversion material and light-scattering material may be disposed in respective regions Bw surrounded by the light reflective dividing wall.

As described above, the embodiments of the present invention may have color filters including red filters R, green filters G, and blue filters B such that the color filters are disposed between the black matrix pattern 1 and the first transparent resin layer 2 or between the transparent substrate 110 and the black matrix pattern 1.

Organic pigments and inorganic pigments can be used as colorants for the black matrix pattern. Examples of organic pigments include carbon black, graphite, aniline black, and cyanine black colorant. Examples of inorganic pigments include titanium oxide, titanium nitride, and iron oxide. Desired light-shielding properties may be obtained with these pigments used alone or in suitable combination thereof. Among the above pigments, carbon black in particular is suitable as a light-shielding material.

Examples of red organic pigments that can be used for the red filter R include red pigments such as C.I. Pigment Red 7, 14, 41, 48:2, 48:3, 48:4, 81:1, 81:2, 81:3, 81:4, 146, 168, 177, 178, 179, 184, 185, 187, 200, 202, 208, 210, 246, 254, 255, 264, 270, 272, and 279. The red filter R may contain a yellow pigment and an orange pigment in combination.

Examples of yellow organic pigments that can be used include C.I. Pigment Yellow 1, 2, 3, 4, 5, 6, 10, 12, 13, 14, 15, 16, 17, 18, 24, 31, 32, 34, 35, 35:1, 36, 36:1, 37, 37:1, 40, 42, 43, 53, 55, 60, 61, 62, 63, 65, 73, 74, 77, 81, 83, 93, 94, 95, 97, 98, 100, 101, 104, 106, 108, 109, 110, 113, 114, 115, 116, 117, 118, 119, 120, 123, 126, 127, 128, 129, 147, 151, 152, 153, 154, 155, 156, 161, 162, 164, 166, 167, 168, 169, 170, 171, 172, 173, 174, 175, 176, 177, 179, 180, 181, 182, 187, 188, 193, 194, 199, 198, 213, and 214. Examples of green pigments that can be used for the green filter G include green pigments such as C.I. Pigment Green 7, 10, 36, and 37. The green filter G may contain such a green pigment and a yellow pigment in combination. Zinc halide phthalocyanine green pigments or aluminum halide phthalocyanine green pigments can be suitably used for the green filter G.

Examples of blue pigments that can be used for the blue filter B include blue pigments such as C.I. Pigment Blue 15, 15:1, 15:2, 15:3, 15:4, 15:6, 16, 22, 60, and 64. The blue filter B may contain such a blue pigment and a purple pigment in combination. Examples of a purple pigment include C.I. Pigment Violet 1, 19, 23, 27, 29, 30, 32, 37, 40, 42, and 50.

When used, these pigments are dispersed in a transparent resin together with an organic solvent and a dispersant. The transparent resin is desired to be a transparent, alkali-soluble and photosensitive resin having a transmittance of 90% or more in the visible range and containing a resin precursor. The above pigments may have a content of 15 mass % to 65 mass % relative to the resin.

Examples of the above photosensitive resin include a polyimide resin, an epoxy resin, an acrylic resin, a melamine resin, a phenol resin, an oxetane resin, a siloxane resin, and a benzoxazine resin which are prepared by allowing a linear polymer having a reactive substituent such as a hydroxyl group, a carboxyl group, or an amino group to react with a (meth)acrylic compound or a cinnamic acid that has a reactive substituent such as an isocyanate group, an aldehyde group, an epoxy group, or a silanol group, to thereby introduce a photo-crosslinkable group such as a (meth)acryloyl group or a styryl group into the linear polymer. In the case of curing by irradiation of ultraviolet light having a wavelength of, for example, 365 nm, a photoinitiator or the like is added.

Third Modification of First Embodiment

Figure 4:
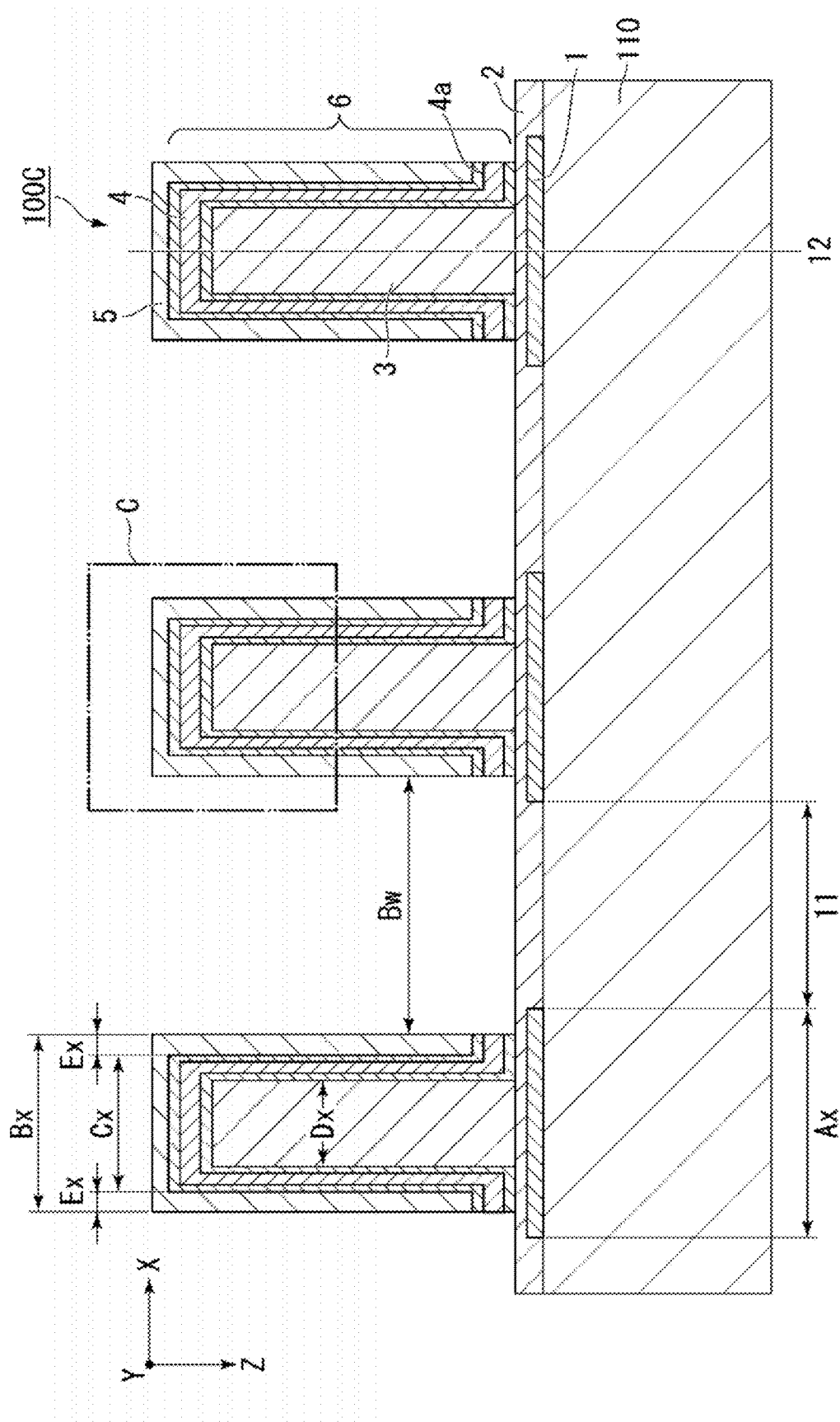
FIG. 4 is a partial cross-sectional view of a black matrix substrate assembly according to a third modification of the first embodiment of the present invention.
Figure 5:
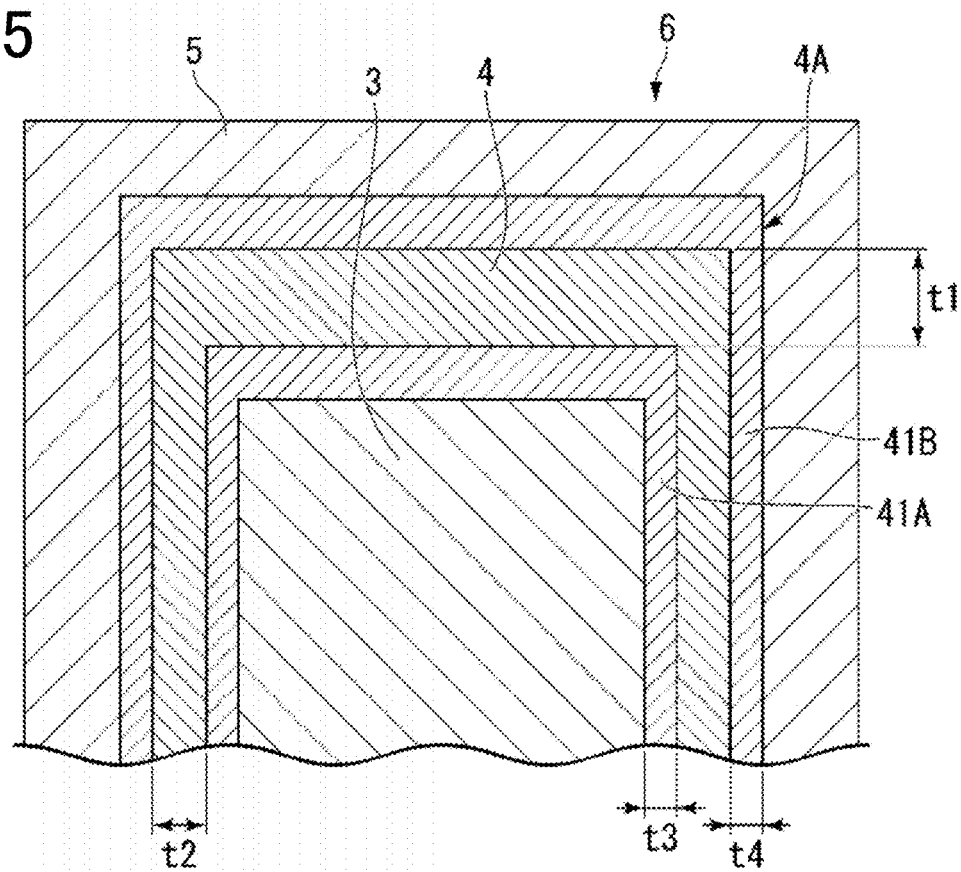
FIG. 5 is an enlarged view of a portion C of FIG. 4.

With reference to FIGS. 4 and 5, a third modification of the black matrix substrate assembly will be described.

FIG. 4 is a partial cross-sectional view of a black matrix substrate assembly 100C. FIG. 5 is an enlarged view of a portion C of FIG. 4.

Silver has a higher light reflectance than aluminum by about 10% in a light wavelength range of 420 nm to 700 nm. Accordingly, forming the light reflective layer from silver or silver alloy enables more effective use of light emitted from light-emitting devices, such as LEDs described later.

However, because silver has low adhesion to a resin and a glass substrate, it is difficult to provide a light reflective layer that reaches practical levels.

FIG. 5 illustrates a light reflective layer 4 including a silver-based layer of silver or silver alloy, a first conductive oxide layer 41A, and a second conductive oxide layer 41B, with the silver-based layer interposed between the first and second conductive oxide layers 41A and 41B. Indium oxide, zinc oxide, tin oxide, or a complex oxide that contains these is conductive and allows high adhesion to silver (or silver alloy), a resin, and a glass substrate. Controlling the amount of indium oxide and zinc oxide added allows adjustment of an etch rate relative to silver (or silver alloy). This makes it possible to form the pattern of the light reflective layer 4 with the silver-based layer interposed between the conductive oxide layers 41A and 41B by wet etching. Indium oxide, zinc oxide, tin oxide, or a complex oxide that contains these has a high transmittance in the visible range.

The third modification proposes the use of silver (or silver alloy) having a high light reflectance.

As described above, the light reflective layer 4 of the third modification includes the silver-based layer interposed between the conductive oxide layers. A deposited thin metal layer of silver or silver alloy may have a thickness t2 of, for example, 0.1 µm or more and 0.3 µm or less at portions facing respective side surfaces of the resin wall pattern. The deposited thin metal layer tends to have a greater thickness t1 at a portion facing the top of the resin wall pattern than its thickness t2 at portions facing respective side surfaces of the resin wall pattern. The first and second conductive oxide layers 41A and 41B may have respective thicknesses t3 and t4 of, for example, 0.01 µm to 0.05 µm. As will be described later, wavelength conversion layers or light-scattering layers may be disposed in respective regions Bw surrounded by the light reflective dividing wall.

Second Embodiment; Display A

Figure 8:
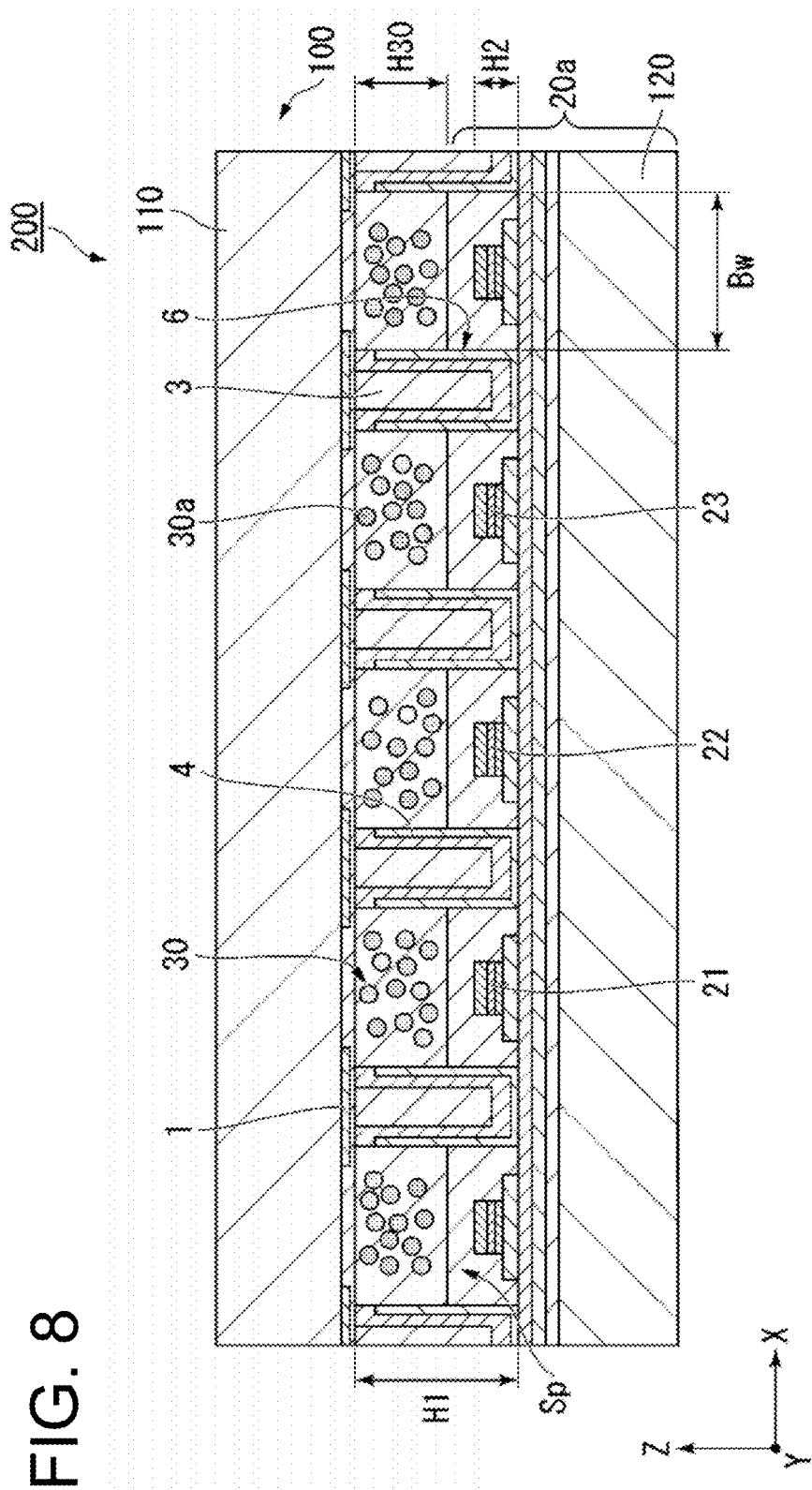
FIG. 8 is a partial cross-sectional view of a display according to a second embodiment of the present invention.

FIG. 8 is a partial cross-sectional view of a display 200 including the black matrix substrate assembly 100 of the first embodiment, according to a display in an embodiment of the present invention. Light-scattering layers 30 are disposed in respective regions Bw surrounded by the light reflective dividing wall 6.

An optical module 20a shown in FIG. 8 includes LEDs as light-emitting devices over an optical module substrate 120. The light-emitting devices are individually driven by thin-film transistors (not shown). With the configuration of the display 200 illustrated in FIG. 8, red light-emitting devices 21, green light-emitting devices 22, and blue light-emitting devices 23 can be disposed for respective openings. These light-emitting devices may be white light-emitting devices.

Examples of the material that can be used for the transparent substrate 110 and the optical module substrate 120 include transparent materials, such as glass, quartz, sapphire, and plastic. The materials of the transparent substrate 110 and the optical module substrate 120 are desired to have the same coefficient of thermal expansion. When the optical module substrate (array substrate) 120 and the transparent substrate 110 are formed of different materials, problems such as warpage or detachment of the substrate may occur from the viewpoint of coefficient of thermal expansion. The array substrate refers to a substrate having thin-film transistors in a matrix that are configured to drive display functional layers such as light-emitting devices or a liquid crystal layer. In this case, one or more thin-film transistors are disposed for each pixel (the smallest unit for display). Driving of a liquid crystal layer typically requires one thin-film transistor for each pixel, and driving of light-emitting devices such as organic EL devices may require seven thin-film transistors for each pixel.

The height H1 of the light reflective dividing wall 6 includes the thickness H30 of the light-scattering layers and the height H2 of the light-emitting devices 21, 22, and 23. When light-emitting devices 21, 22, and 23 having a large height H2 are used, it is desired for the light reflective dividing wall 6 to have a height H1 including the height H2 so as to be greater than the height H2 of the light-emitting devices 21, 22, and 23. In this case, the height H1 may be within a range of, for example, 2 µm to 200 µm. Although the configuration of the light-emitting devices is not illustrated in detail as shown, these light-emitting devices may include, for example, an upper electrode, an n-type semiconductor layer, a light-emitting layer, a p-type semiconductor layer, a lower electrode, a low-melting alloy layer for flip-chip mounting, and a reflective electrode. Semiconductor layers of a light-emitting device, including a light-emitting layer, may each be comprised of semiconductor such as GaN, AlGaN, InGaN, InAlN, AlInGaN, ZnSe, GaP, AlGaP, AlGaAs, or AlInGaP, or may each be a laminate of layers of such semiconductors.

When wavelength conversion layers are disposed in respective regions surrounded by the light reflective dividing wall, the light reflective dividing wall is required to have a height H1 greater than or equal to the thickness of the wavelength conversion layers. For example, the height H1 may be within a range of 2 µm to 200 µm.

Although the height H1 of the light reflective dividing wall can be greater than 200 µm, an appropriate upper limit of the height H1 is 200 µm because it is difficult to form a thick coating film after drying when a common coater, such as a curtain coater or a slit coater, is used.

Displays according to embodiments of the present invention may include, as "display functional layer(s)", a plurality of light-emitting diode devices known as light-emitting diodes (LEDs), a plurality of organic electroluminescent (organic EL) devices also known as organic light-emitting diodes (OLEDs), or a liquid crystal layer.

As light-emitting devices, LED chips for high-resolution applications are preferably LED chips of a vertical type that include an n-side electrode and a p-side electrode separated in the thickness direction thereof. For large displays such as for TVs, wire bonding mounting can be employed using LED chips of a horizontal type. The abovementioned flip-chip mounting of light-emitting devices may be replaced with mounting using anisotropic conductive films.

LEDs are typically produced on a sapphire substrate, a silicon substrate, or the like by epitaxial growth using MOCVD or the like with a buffer layer interposed therebetween. Such an LED is separated from the sapphire substrate, silicon substrate, or the like by laser ablation and can thus be used as an LED chip.

For light-scattering particles 30a, optically isotropic transparent microparticles and metal oxide particles can be used. Light-scattering layers preferably contain micron-size light-scattering particles having an average diameter of, for example, 0.03 µm or more and 5.0 µm or less. The light-scattering layers described later may contain such micron-size particles having an average diameter of 0.03 µm or more and 5.0 µm or less.

The term "optically isotropic" used for optically isotropic transparent microparticles means that transparent microparticles used in embodiments of the present invention have a crystal structure with equal a-, b-, c-axes, or are amorphous such that they are isotropic with no influence on the propagation of light due to crystal axes or crystal structures. Silica microparticles have an amorphous structure. Microparticles of resin, such as resin beads, having various properties including a refractive index are known, and the light-scattering layers may further contain these microparticles. Examples of such resin microparticles include those of resin such as acrylic, styrene, urethane, nylon, melamine, or benzoguanamine.

Metal oxides that can be used for the above metal oxide particles are oxides that contain a metal selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pr, Nd, Pm, Sm, Eu, Gd, Tb, Dy, Ho, Er, Tm, Yb, Ti, Sb, Sn, Zr, Nb, Ce, Ta, In, and combinations thereof. More specifically, such a metal oxide may be selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO—Al, $Nb_2O_3$, SnO, MgO, and combinations thereof. If necessary, these materials may be surface-treated with a compound having one or more unsaturated bonds, such as acrylate.

When used, these fluorescent materials, quantum dots, or light-scattering particles are dispersed in a transparent resin together with an organic solvent and a dispersant. The transparent resin is desired to be a transparent, alkali-soluble and photosensitive resin having a transmittance of 90% or more in the visible range and containing a resin precursor. The above fluorescent materials, quantum dots, or light-scattering particles may have a content of 15 mass % to 65 mass % relative to the resin.

Examples of the above photosensitive resin include a polyimide resin, an epoxy resin, an acrylic resin, a melamine resin, a phenol resin, an oxetane resin, a siloxane resin, and a benzoxazine resin which are prepared by allowing a linear polymer having a reactive substituent such as a hydroxyl group, a carboxyl group, or an amino group to react with a (meth)acrylic compound or a cinnamic acid that has a reactive substituent such as an isocyanate group, an aldehyde group, an epoxy group, or a silanol group, to thereby introduce a photo-crosslinkable group such as a (meth) acryloyl group or a styryl group into the linear polymer. In the case of curing by irradiation of ultraviolet light having a wavelength of, for example, 365 nm, a photoinitiator or the like is added.

Second Embodiment; Display B

Figure 9:
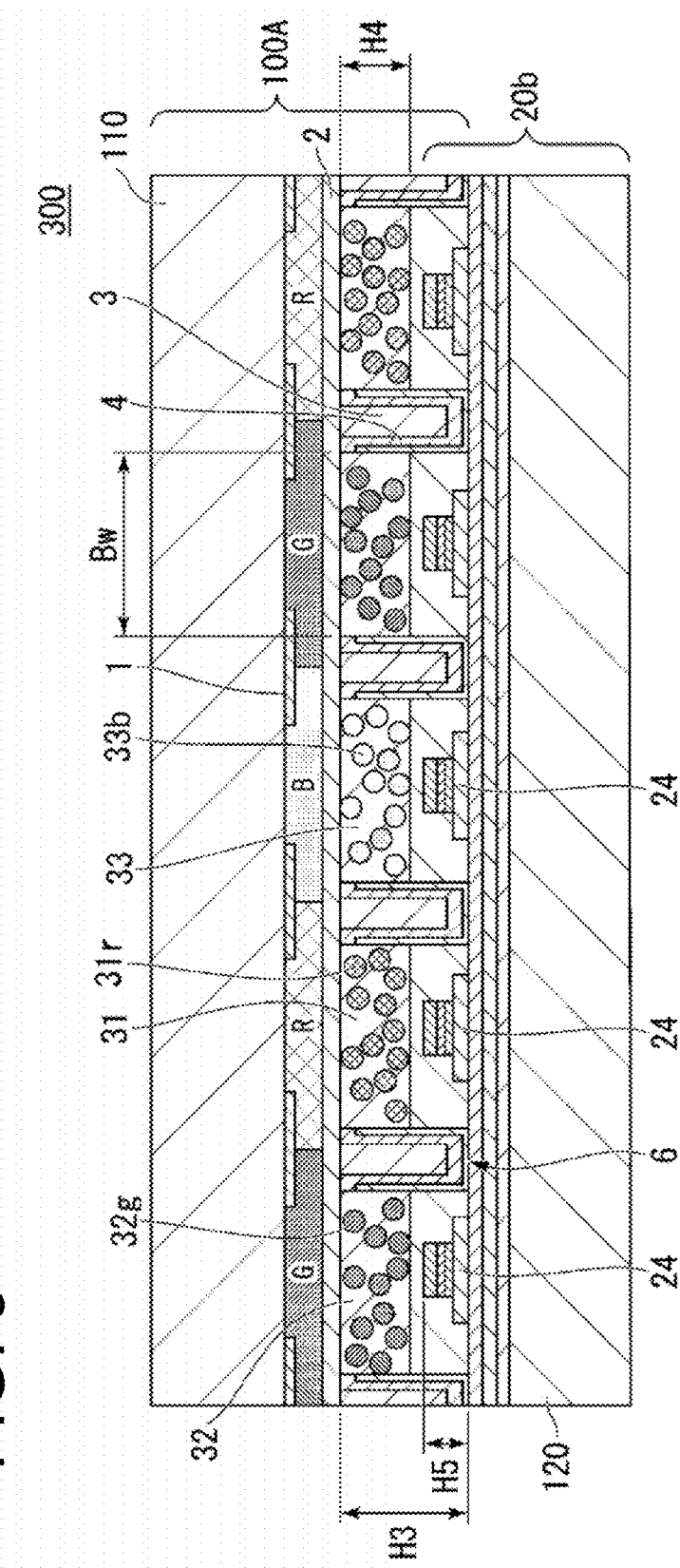
FIG. 9 is a partial cross-sectional view of a display according to a first modification of the second embodiment of the present invention.

FIG. 9 is a partial cross-sectional view of a display 300 including the black matrix substrate assembly 100A in the first modification of the first embodiment, according to a display in an embodiment of the present invention. Wavelength conversion layers 31, 32 and 33 are disposed in respective regions Bw surrounded by the light reflective dividing wall 6. For the wavelength conversion layers 31, 32 and 33, red inorganic fluorescent materials 31r, green inorganic fluorescent materials 32g, and blue inorganic fluorescent materials 33b may be used, respectively.

An optical module 20b includes light-emitting devices 24 (LEDs) over an optical module substrate 120. These light-emitting devices are individually driven by thin-film transistors (not shown). The light-emitting devices 24 are disposed for respective openings and may be near-ultraviolet light-emitting devices configured to emit light having a wavelength of, for example, 300 nm to 400 nm.

The height H3 of the light reflective dividing wall 6 includes the thickness H4 of the wavelength conversion layers and the height H5 of the light-emitting devices 24. The height H3 is desired to be greater than or equal to the sum of the thickness H4 and the height H5. The light reflective dividing wall 6 may have a height H3 in the range, for example, of 2 µm to 200 µm.

Although quantum dots or organic fluorescent dyes can be used for the wavelength conversion layers 31, 32 and 33, these materials are greatly decomposed and their light-emitting properties are considerably degraded when exposed to excitation light or heat produced by the LEDs. For this reason, inorganic fluorescent materials having high heat and light resistance are preferably used for the wavelength conversion layers 31, 32 and 33. When inorganic fluorescent particles used for the wavelength conversion layers have a diameter of 1.0 µm or more and 10.0 µm or less, their wavelength conversion efficiencies and dispersion thereof in a coating film are good. Instead of or in addition to the inorganic fluorescent materials, the wavelength conversion layers may contain quantum dots. The thickness of the wavelength conversion layers is required to allow inorganic fluorescent materials and/or quantum dots to sufficiently absorb excitation light emitted from light sources and convert the absorbed light. In light of this, the wavelength conversion layers may have a thickness in the range, for example, of 2 µm to 200 µm.

Examples of red inorganic fluorescent materials 31r include $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:MN^{4+}$, $Mg_4GeO_6:MN^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

Examples of green inorganic fluorescent materials 32g include $(BaMg)Al_{10}O_{17}:Eu^{2+}$, $Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5:Ce^{3+}$, $Sr_2P_2O_7$-$Sr_2B_2O_5:Eu^{3+}$, $(BaCaMG)_5(PO_4)_3Cl:Eu^{2+}$, $Sr_2Si_3O_8$-$2SrCl_2:Eu^{2+}$, $Zr_2SiO_4$, $MgAl_{11}O_{19}:Ce^{3+}$, $Tb^{3+}$, $Ba_2SiO_4:Eu^{2+}$, $Sr_2SiO_4:Eu^{2+}$, $Sr_2SiO_4:Eu^{2+}$, and $(BaSr)SiO_4:Eu^{2+}$.

Examples of blue inorganic fluorescent materials 33b include $Sr_2P_2O_7:Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, $(Ba,Sr)(Mg,Mn)Al_{10}O_{17}:Eu^{2+}$, $(Sr,Ca,Ba_2,Mg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr,Ca,Ba)_5(PO_4)_3Cl:Eu^{2+}$, $BaMg_2Al_{16}O_{27}:Eu^{2+}$, $(Ba,Ca)_5(PO_4)_3Cl:Eu^{2+}$, $Ba_3MgSi_2O_8:Eu^{2+}$, and $Sr_3MgSi_2O_8:Eu^{2+}$.

Second Embodiment; Display C

Figure 10:
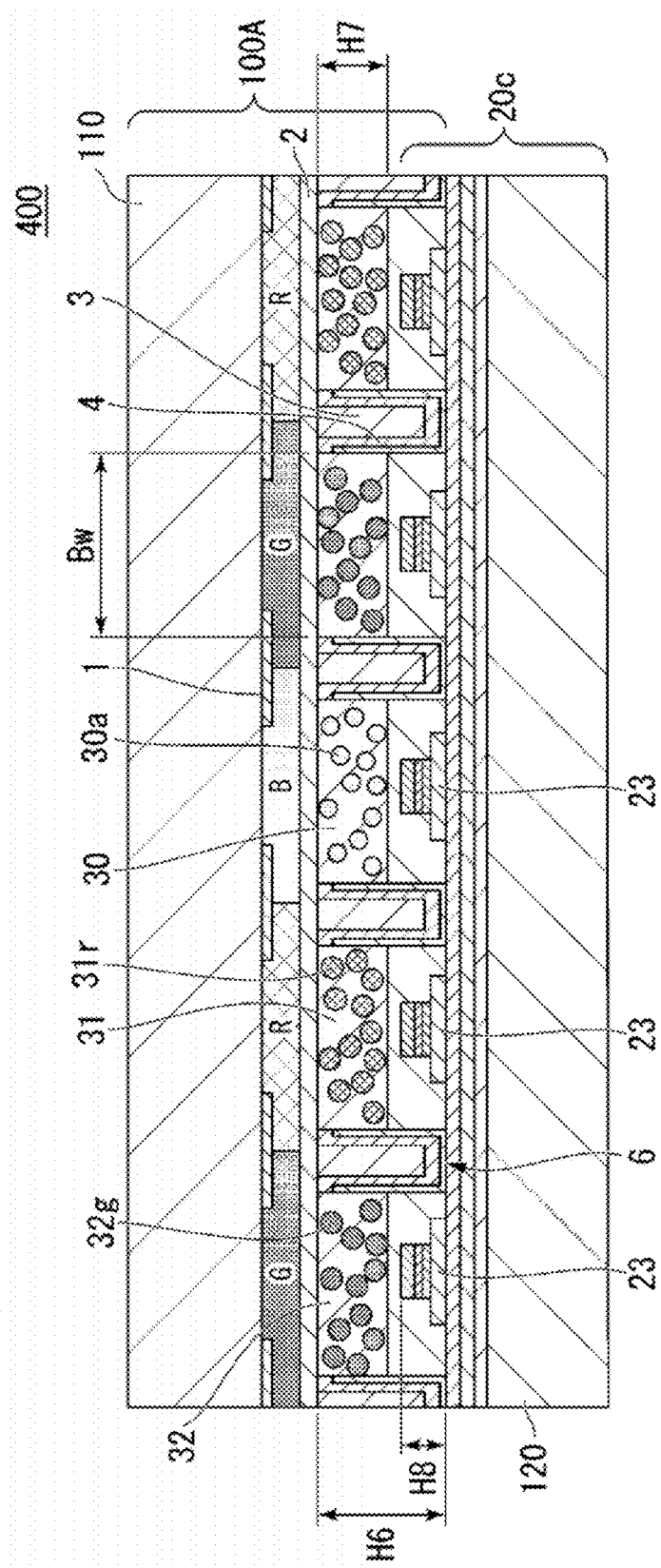
FIG. 10 is a partial cross-sectional view of a display according to a second modification of the second embodiment of the present invention.

FIG. 10 is a partial cross-sectional view of a display 400 including the black matrix substrate assembly 100A in the first modification of the first embodiment, according to a display in an embodiment of the present invention. Wavelength conversion layers 31 and 32 and light-scattering layers 30 are disposed in respective regions Bw surrounded by the light reflective dividing wall 6. For the wavelength conversion layers 31, wavelength conversion layers 32, and light-scattering layers 30, red inorganic fluorescent materials 31r, green inorganic fluorescent materials 32g, and light-scattering particles 30a may be used, respectively.

An optical module 20c includes light-emitting devices 23 (LEDs) over an optical module substrate 120. These light-emitting devices are individually driven by thin-film transistors (not shown). The light-emitting devices 23 are disposed for respective openings and may be blue light-emitting devices configured to emit light having a wavelength in the range, for example, of 400 nm to 500 nm.

The height H6 of the light reflective dividing wall 6 includes the thickness H7 of the wavelength conversion layers 31 and 32 and the light-scattering layers 30 and the height H8 of the light-emitting devices 23. The height H6 is desired to be greater than or equal to the sum of the thickness H7 and the height H8. The light reflective dividing wall 6 may have a height H3 in the range, for example, of 2 μm to 200 μm.

Various applications are possible for the displays including black matrix substrates according to the above embodiments. Examples of electronics for which the displays according to the above embodiments can be used include mobile phones, portable game machines, portable information terminals, personal computers, electronic books, video cameras, digital still cameras, head-mounted displays, navigation systems, sound reproduction devices (car audio systems, digital audio players, and the like), copiers, facsimiles, printers, multifunction printers, vending machines, automated teller machines (ATM), personal identification devices, optical communication devices, and IC cards. The embodiments described above can be used in any combination. For electronic devices provided with the displays according to embodiments of the present invention, it is desired to mount antennas on these devices to thereby make them capable of communication and contactless reception and supply of electricity.

Preferred embodiments of the present invention have been described by way of example only and should not be construed as limiting. Additions, omissions, substitutions, and other changes may be made without departing from the scope of the present invention. Therefore, the present invention should not be construed as being limited by the foregoing description and is defined by the claims.

The present application relates to a black matrix substrate assembly that can be used to provide bright displays, including LED displays, such as microLED displays or mini-LED displays, and organic EL displays, such that the displays have a reduced decrease in contrast or color purity due to light emitted from a light-emitting device and entering an adjacent pixel as stray light, and to a display including the black matrix substrate assembly.

A first aspect of the present invention provides a black matrix substrate assembly including:
   a transparent substrate having a major surface;
   a black matrix pattern comprising:
      a first grid of first and second black linear segments and arranged two-dimensionally to face the major surface of the transparent substrate;
      the first black linear segments being arranged in a predetermined first direction and each having a width Ax and a first center line, the second black linear segments being arranged in a predetermined second direction and each having a width Ay and having a second center line;
   a first transparent resin layer arranged to cover the black matrix pattern;
   a resin wall pattern comprising:
      a second grid of first and second wall linear segments and arranged to face the first transparent resin layer,
      the first wall linear segments being arranged in the predetermined first direction and each having a width Dx and a first center line, the second wall linear segments being arranged in the predetermined second direction and each having a width Dy and a second center line, the width Dx of each first wall linear segment being smaller than the width Ax of each first black linear segment, the width Dy of each second wall linear segment being smaller than the width Ay of each second black linear segment,
      the first center line of each first wall linear segment being aligned with the first center line of the corresponding first black linear segment when viewed in a predetermined view direction perpendicular to the major surface of the transparent substrate, the second center line of each second wall linear segment being aligned with the second center line of the corresponding second black linear segment when viewed in the predetermined view direction;
   a light reflective layer comprising
      first reflective linear segments; and
      second reflective linear segments,
      the light reflective layer being arranged to face the resin wall pattern,
      the first reflective linear segments being arranged in the predetermined first direction and each having a width Cx and a first center line, the second reflective linear segments being arranged in the predetermined second direction and each having a width Cy and a second center line, the width Cx of each first reflective linear segment being larger than the width Dx of each first wall linear segment, the width Cy of each second reflective linear segment being larger than the width Dy of each second wall linear segment,
      the first center line of each first reflective linear segment being aligned with the first center line of the corresponding first black linear segment when viewed in the predetermined view direction, the second center line of each second reflective linear segment being aligned with the second center line of the corresponding second black linear segment when viewed in the predetermined view direction,
      each first reflective linear segment of the light reflective layer further comprising:
      a pair of first brims located within the width Ax of the corresponding first black linear segment when viewed in the predetermined view direction, the first brims extending from both ends of the corresponding first light reflective linear segment opposingly in the predetermined first direction to be symmetric with respect to the first center line of the corresponding first reflective linear segment, each of the first brims having a width Ex,
      each second reflective linear segment of the light reflective layer further comprising:
      a pair of second brims located within the width Ay of the corresponding second black linear segment when viewed in the predetermined view direction, the second brims extending from both ends of the corresponding second light reflective linear segment opposingly in the predetermined second direction to be symmetric with respect to the second center line of the corresponding second reflective linear segment, each of the second brims having a width Ey; and
   a transparent protective layer comprising
      first protective linear segments; and
      second protective linear segments,
      the transparent protective layer being arranged to face the light reflective layer,
      the first protective linear segments being arranged in the predetermined first direction and each having a width Bx, the second protective linear segments being arranged in the predetermined second direction and each having a width By,
      the width Bx of each first protective linear segment being greater than or equal to a first total width of the corresponding first reflective linear segment when viewed in the predetermined view direction, the first total width of each first reflective linear segment being the sum of the width Cx and the widths Ex of the first brims, the width By of each second protective linear segment being greater than or equal to a second total width of the corresponding second reflective linear segment when viewed in the predetermined view direction, the second total width of each second reflective linear segment being the sum of the width Cy and the widths Ey of the second brims.

According to a second aspect of the present invention, the black matrix substrate assembly according to the first aspect may be configured such that:

the width Bx is less than or equal to the width Ax; and
the width By is less than or equal to the width Ay.

According to a third aspect of the present invention, the black matrix substrate assembly according to the first aspect may further include:

color filters disposed between the transparent substrate and the black matrix pattern when viewed in cross section, the color filters including a red filter, a green filter, and a blue filter.

According to a fourth aspect of the present invention, the black matrix substrate assembly according to the first aspect may further include:

color filters disposed between the black matrix pattern and the first transparent resin layer when viewed in cross section, the color filters including a red filter, a green filter, and a blue filter.

According to a fifth aspect of the present invention, the black matrix substrate assembly according to the first aspect may be configured such that:

the resin wall pattern has a height of 2 μm or more and 200 μm or less in a direction perpendicular to the major surface of the transparent substrate.

Here, an aspect ratio or the width of a dividing wall pattern varies greatly depending on a pixel pitch or the thickness of wavelength conversion layers.

According to a sixth aspect of the present invention, the black matrix substrate assembly according to the first aspect may be configured such that:

the first wall linear segments and the second wall linear segments are arranged to cross each other to define a plurality of grid regions, each of the first wall linear segments having the width Bx, each of the second wall linear segments having the width By, the black matrix substrate assembly further including:

light wavelength conversion layers disposed in the respective grid regions.

According to a seventh aspect of the present invention, the black matrix substrate assembly according to the first aspect may be configured such that:

the first wall linear segments and the second wall linear segments are arranged to cross each other to define a plurality of grid regions, each of the first wall linear segments having the width Bx, each of the second wall linear segments having the width By, the black matrix substrate assembly further including:

light-scattering layers disposed in the respective grid regions.

According to an eighth aspect of the present invention, the black matrix substrate assembly according to the first aspect may be configured such that:

the light reflective layer is comprised of aluminum or aluminum alloy.

According to a ninth aspect of the present invention, the black matrix substrate assembly according to the first aspect may be configured such that:

the light reflective layer includes:
 a first conductive oxide layer;
 a second conductive oxide layer; and
 a silver-based layer made of silver or silver alloy,
  the silver-based layer being interposed between the first and second conductive oxide layers.

According to a tenth aspect of the present invention, the black matrix substrate assembly according to the ninth aspect may be configured such that:

the first and second conductive oxide layers each contain at least indium oxide and zinc oxide.

According to an eleventh aspect of the present invention, the black matrix substrate assembly according to the ninth aspect may be configured such that:

the first conductive oxide layer has a first thickness; and
the second conductive oxide layer has a second thickness, the first thickness being different from the second thickness.

According to a twelfth aspect of the present invention, the black matrix substrate assembly according to the ninth aspect may be configured such that:

the first and second conductive oxide layers each contain at least indium oxide,
the first and second conductive oxide layers being different from each other in amount of indium oxide contained therein.

According to a thirteenth aspect of the present invention, the black matrix substrate assembly according to the first aspect may be configured such that:

the first transparent resin layer contains at least a yellow pigment, an ultraviolet absorbent, or transparent microparticles.

A fourteenth aspect of the present invention provides a display including:

a black matrix substrate assembly according to any one of the first to twelfth aspects.

A method for producing a black matrix substrate assembly for a display, including the steps of:

(1) forming a black matrix pattern over a major surface of a transparent substrate;
(2) forming a first transparent resin layer over the black matrix pattern;
(3) forming a resin wall pattern over the first transparent resin layer;
(4) forming a thin metal film covering the resin wall pattern and the first transparent resin layer;
(5) forming a photosensitive protective film covering the thin metal film;
(6) subjecting the photosensitive protective film to exposure, development, and curing, to form a transparent protective layer comprised of the cured photosensitive protective film such that portions of the thin metal film are exposed; and
(7) removing the exposed portions of the thin metal film by wet etching using the transparent protective layer as a mask, to form a light reflective layer comprised of the wet etched thin metal film, thereby forming a light reflective dividing wall including the resin wall pattern, the light reflective layer, and the transparent protective layer.

According to a sixteenth aspect of the present invention, the method according to the fifteenth aspect may further include:

a step of forming a red filter, a green filter, and a blue filter.

The embodiments of the present invention can provide bright displays, including LED displays, such as microLED displays or mini-LED displays, and organic EL displays, such that the displays offer reduced decrease in contrast or color purity due to light emitted from a light-emitting device and entering an adjacent pixel as stray light, thereby having improved viewability and enhanced light usage efficiency.

REFERENCE SIGNS LIST

1 . . . Black matrix pattern
2 . . . First transparent resin layer
3 . . . Resin wall pattern
4 . . . Light reflective layer
4a . . . Brim
5 . . . Transparent protective layer
6 . . . Light reflective dividing wall
7 . . . Black film
8 . . . Photosensitive resin film
9 . . . Thin metal film
10 . . . Photosensitive protective film
11 . . . Pixel opening
12 . . . Central axis
20a, 20b, 20c . . . Optical module
21, 22, 23, 24 . . . Light-emitting element
30 . . . Light-scattering layer
30a . . . Light-scattering particle
31, 32, 33 . . . Wavelength conversion layer
31r . . . Red inorganic fluorescent material
32g . . . Green inorganic fluorescent material
33b . . . Blue inorganic fluorescent material
41A . . . First conductive oxide layer
41B . . . Second conductive oxide layer
50 . . . Color filter layer
100, 100A, 100B, 100C . . . Black matrix substrate assembly
110 . . . Transparent substrate
120 . . . Optical module substrate
200, 300, 400 . . . Display
Ax, Ay . . . Width of black matrix pattern
Bx, By . . . Width of transparent protective layer
Cx, Cy . . . Width of light reflective layer
Dx, Dy . . . Width of resin wall pattern
Ex, Ey . . . Width of brim
R . . . Red filter
G . . . Green filter
B . . . Blue filter
Bw . . . Region surrounded by light reflective dividing wall
t1, t2 . . . Thickness of light reflective layer
t3, t4 . . . Thickness of conductive oxide layer
H1, H3, H6 . . . Height of light reflective dividing wall
H2, H5, H8 . . . Height of light-emitting device
H4 . . . Height of wavelength conversion layer
H7 . . . Height of wavelength conversion layer and light-scattering layer
H30 . . . Height of light-scattering layer Obviously, numerous modifications and variations of the present invention are possible in light of the above teachings. It is therefore to be understood that within the scope of the appended claims, the invention may be practiced otherwise than as specifically described herein.

What is claimed is:

1. A black matrix substrate assembly, comprising:
a transparent substrate having a surface;
a black matrix pattern formed on the surface;
a transparent resin layer that covers the black matrix pattern;
a resin wall pattern formed on the transparent resin layer;
a light reflective layer formed on the resin wall pattern; and
a transparent protective layer formed on the light reflective layer,
wherein, when viewed in a view direction perpendicular to the surface of the transparent substrate, the black matrix pattern includes first black linear segments and second black linear segments that are formed two-dimensionally, the first black linear segments each have a width Ax in a first direction and have a first center line, and the second black linear segments each have a width Ay in a second direction and have a second center line,
the resin wall pattern includes first wall linear segments and second wall linear segments, the first wall linear segments each have a width Dx in the first direction and have a first center line, the second wall linear segments each have a width Dy in the second direction and have a second center line, the width Dx is smaller than the width Ax, and the width Dy is smaller than the width Ay,
when viewed in the view direction, the first center line of each first wall linear segment is aligned with the first center line of a corresponding first black linear segment, and the second center line of each second wall linear segment is aligned with the second center line of a corresponding second black linear segment,
the light reflective layer includes first reflective linear segments and second reflective linear segments, the first reflective linear segments each have a width Cx in the first direction and have a first center line, the second reflective linear segments each have a width Cy in the second direction and have a second center line, the width Cx is larger than the width Dx, and the width Cy is larger than the width Dy,
when viewed in the view direction, the first center line of each first reflective linear segment is aligned with the first center line of the corresponding first black linear segment, and the second center line of each second reflective linear segment is aligned with the second center line of the corresponding second black linear segment,
each first reflective linear segment of the light reflective layer includes a pair of first brims each having a width Ex and formed within the width Ax of the corresponding first black linear segment when viewed in the view direction, the first brims extend in an opposite direction from both ends of the corresponding first light reflective linear segment along with the first direction to be symmetric with respect to the first center line of the corresponding first reflective linear segment,
each second reflective linear segment of the light reflective layer includes a pair of second brims each having a width Ey and formed within the width Ay of the corresponding second black linear segment when viewed in the view direction, the second brims extend in an opposite direction from both ends of the corresponding second light reflective linear segment along with the second direction to be symmetric with respect to the second center line of the corresponding second reflective linear segment, the transparent protective layer includes first protective linear segments and second protective linear segments, the first protective linear segments each have a width Bx in the first direction, the second protective linear segments each have a width By in the second direction, the width Bx of each first protective linear segment is greater than or equal to a first total width of the corresponding first reflective linear segment when viewed in the view direction, the first total width of each first reflective linear segment is a sum of the width Cx and the widths Ex of the first brims, the width By of each second protective linear segment is greater than or equal to a second total width of the corresponding second reflective linear segment when viewed in the view direction, and the second total width of each second reflective linear segment is a sum of the width Cy and the widths Ey of the second brims.

2. The black matrix substrate assembly according to claim 1, wherein the width Bx is less than or equal to the width Ax, and the width By is less than or equal to the width Ay.

3. The black matrix substrate assembly according to claim 1, further comprising:
a plurality of color filters positioned between the transparent substrate and the black matrix pattern when viewed in a cross section,
wherein the color filters include a red filter, a green filter, and a blue filter.

4. The black matrix substrate assembly according to claim 1, further comprising:
a plurality of color filters positioned between the black matrix pattern and the transparent resin layer when viewed in a cross section,
wherein the color filters include a red filter, a green filter, and a blue filter.

5. The black matrix substrate assembly according to claim 1, wherein the resin wall pattern has a height of 2 μm-200 μm in a direction perpendicular to the surface of the transparent substrate.

6. The black matrix substrate assembly according to claim 1, further comprising:
a plurality of light wavelength conversion layers formed in grid regions defined by the first wall linear segments and the second wall linear segments that cross each other,
wherein each of the first wall linear segments has the width Bx, and each of the second wall linear segments has the width By.

7. The black matrix substrate assembly according to claim 1, further comprising:
a plurality of light-scattering layers formed in grid regions defined by the first wall linear segments and the second wall linear segments that cross each other,
wherein each of the first wall linear segments has the width Bx, and each of the second wall linear segments has the width By.

8. The black matrix substrate assembly according to claim 1, wherein the light reflective layer comprises aluminum or an aluminum alloy.

9. The black matrix substrate assembly according to claim 1, wherein the light reflective layer includes
a first conductive oxide layer,
a second conductive oxide layer, and
a silver-based layer interposed between the first and second conductive oxide layers and comprising silver or a silver alloy.

10. The black matrix substrate assembly according to claim 9, wherein the first and second conductive oxide layers each include indium oxide and zinc oxide.

11. The black matrix substrate assembly according to claim 9, wherein the first conductive oxide layer has a first thickness, and the second conductive oxide layer has a second thickness different from the first thickness.

12. The black matrix substrate assembly according to claim 9, wherein the first and second conductive oxide layers each include indium oxide, and
the first and second conductive oxide layers differ from each other in an amount of indium oxide included therein.

13. The black matrix substrate assembly according to claim 1, wherein the transparent resin layer includes a yellow pigment, an ultraviolet absorbent, or transparent microparticles.

14. A display, comprising:
the black matrix substrate assembly of claim 1.

15. A method for producing a black matrix substrate assembly, comprising:
forming a black matrix pattern on a surface of a transparent substrate;
forming a transparent resin layer on the black matrix pattern;
forming a resin wall pattern on the transparent resin layer;
forming a thin metal film covering the resin wall pattern and the transparent resin layer;
forming a photosensitive protective film covering the thin metal film;
subjecting the photosensitive protective film to exposure, development, and curing, to form a transparent protective layer comprising a cured photosensitive protective film such that portions of the thin metal film are exposed; and
removing exposed portions of the thin metal film by wet etching using the transparent protective layer as a mask, to form a light reflective layer comprising a wet etched thin metal film, and form a light reflective dividing wall including the resin wall pattern, the light reflective layer, and the transparent protective layer.

16. The method according to claim 15, further comprising:
forming a plurality of filters including a red filter, a green filter, and a blue filter.

* * * * *